(12) United States Patent
Kang et al.

(10) Patent No.: US 11,874,603 B2
(45) Date of Patent: Jan. 16, 2024

(54) PHOTORESIST COMPOSITION COMPRISING AMIDE COMPOUND AND PATTERN FORMATION METHODS USING THE SAME

(71) Applicant: Rohm And Haas Electronic Materials Korea Ltd., Cheonan-si (KR)

(72) Inventors: Philjae Kang, Cheonan-si (KR); Kwang Mo Choi, Cheonan-si (KR); Yoo Jung Yoon, Cheonan-si (KR); Won Seok Lee, Cheonan-si (KR); Hae-Jin Lim, Cheonan-si (KR)

(73) Assignee: ROHM AND HAAS ELECTRONIC MATERIALS KOREA LTD., Cheonan-si (KR)

( * ) Notice: Subject to any disclaimer, the term of this patent is extended or adjusted under 35 U.S.C. 154(b) by 0 days.

(21) Appl. No.: 17/475,436

(22) Filed: Sep. 15, 2021

(65) Prior Publication Data

US 2023/0099348 A1    Mar. 30, 2023

(51) Int. Cl.
| | |
|---|---|
| *G03F 7/039* | (2006.01) |
| *G03F 7/38* | (2006.01) |
| *G03F 7/004* | (2006.01) |
| *G03F 7/34* | (2006.01) |
| *G03F 7/32* | (2006.01) |

(52) U.S. Cl.
CPC .......... *G03F 7/0397* (2013.01); *G03F 7/0045* (2013.01); *G03F 7/0392* (2013.01); *G03F 7/325* (2013.01); *G03F 7/34* (2013.01)

(58) Field of Classification Search
CPC ......... G03F 7/0397; G03F 7/0392; G03F 7/38
See application file for complete search history.

(56) References Cited

U.S. PATENT DOCUMENTS

| | | |
|---|---|---|
| 4,189,323 A | 2/1980 | Buhr |
| 5,492,793 A | 2/1996 | Breyta et al. |
| 5,843,624 A | 12/1998 | Houlihan et al. |
| 5,929,176 A | 7/1999 | Kim et al. |
| 6,042,997 A | 3/2000 | Barclay et al. |
| 6,048,662 A | 4/2000 | Bruhnke et al. |
| 6,048,664 A | 4/2000 | Houlihan et al. |
| 6,057,083 A | 5/2000 | Taylor et al. |
| 6,090,526 A | 7/2000 | Kumar |
| 6,136,501 A | 10/2000 | Trefonas, III et al. |
| 6,306,554 B1 | 10/2001 | Barclay et al. |
| 6,680,159 B2 | 1/2004 | Barclay et al. |
| 6,692,888 B1 | 2/2004 | Barclay et al. |
| 6,790,579 B1 | 9/2004 | Goodall et al. |
| 7,220,532 B2 * | 5/2007 | Takata ................. G03F 7/0045 430/921 |
| 7,244,542 B2 | 7/2007 | Bae et al. |
| 8,206,886 B2 | 6/2012 | Kodama |
| 8,431,325 B2 | 4/2013 | Hashimoto et al. |
| 2004/0053171 A1 | 3/2004 | Takata et al. |
| 2011/0294069 A1 | 12/2011 | Bae et al. |
| 2012/0064456 A1 | 3/2012 | Bae et al. |
| 2012/0077120 A1 | 3/2012 | Prokopowicz et al. |
| 2013/0244178 A1 | 9/2013 | Prokopowicz et al. |
| 2013/0244438 A1 | 9/2013 | Bae et al. |
| 2014/0038102 A1 | 2/2014 | Park et al. |
| 2020/0183279 A1 * | 6/2020 | Marumo ............... G03F 7/0397 |

FOREIGN PATENT DOCUMENTS

| | | |
|---|---|---|
| EP | 0930542 A1 | 7/1999 |
| EP | 1008913 A1 | 6/2000 |
| WO | 0186353 A1 | 11/2001 |

* cited by examiner

*Primary Examiner* — John S Chu
(74) *Attorney, Agent, or Firm* — CANTOR COLBURN LLP

(57) ABSTRACT

Disclosed herein is a photoresist composition comprising a first polymer comprising an acid labile group; a photoacid generator; and an acid diffusion control agent that comprises a tri-alkyl amide compound having a lipophilicity (log P) value that is greater than 11.

9 Claims, No Drawings

PHOTORESIST COMPOSITION COMPRISING AMIDE COMPOUND AND PATTERN FORMATION METHODS USING THE SAME

FIELD

The invention relates generally to the manufacture of electronic devices. More specifically, this invention relates to photoresist compositions and to photolithographic processes which allow for the formation of fine patterns using a negative tone development process.

BACKGROUND

Considerable effort has been made to extend the practical resolution capabilities of positive tone development in immersion lithography from both materials and processing standpoints. One such example involves negative tone development (NTD), an image reversal technique allowing for use of the superior imaging quality obtained with bright field masks to print the critical dark field layers. NTD resists typically employ a resin having acid-labile groups and a photoacid generator. Exposure to actinic radiation causes the photoacid generator to form an acid which, during post-exposure baking, causes cleavage of the acid-labile groups in the resin. As a result, a difference in solubility characteristics in organic developers is created between exposed and unexposed regions of the resist such that unexposed regions of the resist are removed by the developer, leaving behind a pattern created by the insoluble exposed regions. Such a process is described, for example, in U.S. Pat. No. 6,790,579, to Goodall et al. For the resist chemistries described, the exposed areas of the resist layer can be selectively removed with an alkaline developer or, alternatively, the unexposed regions can be selectively removed by treatment with a suitable nonpolar solvent for negative tone development.

The inventors have observed that surface inhibition of the photoresist in NTD processes can result in "necking" of contact holes or "T-topping" in line and trench patterns in the developed resist patterns. The occurrence of necking and T-topping generally results in a poor process window including depth of focus and exposure latitude. These problems can lead, for example, to random missing contact holes or to micro-bridging defects in the case of narrow trench or line pattern formation, thereby adversely impacting device yield.

U.S. Patent Application Pub. No. US2011/0294069A1, to Bae et al, discloses photoresist compositions that include a matrix polymer that is acid sensitive, a particular additive polymer that has a surface energy lower than a surface energy of the first polymer; a photoacid generator and a solvent. While that document recognizes problems associated with surface inhibition, further improved solutions to this problem are needed.

There is a continuing need in the art for improved compositions and photolithographic methods for negative tone development which allow for the formation of fine patterns in electronic device fabrication and which address one or more problems associated with the state of the art.

SUMMARY

Disclosed herein is a photoresist composition comprising a first polymer comprising an acid labile group; a photoacid generator; and an acid diffusion control agent that comprises a tri-alkyl amide compound having a lipophilicity (log P) value that is greater than 11.

DETAILED DESCRIPTION

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise.

As used herein, an "acid-labile group" refers to a group in which a bond is cleaved by the catalytic action of an acid, optionally and typically with thermal treatment, resulting in a polar group, such as a carboxylic acid or alcohol group, being formed on the polymer, and optionally and typically with a moiety connected to the cleaved bond becoming disconnected from the polymer. Such acid is typically a photo-generated acid with bond cleavage occurring during post-exposure baking. Suitable acid-labile groups include, for example: tertiary alkyl ester groups, secondary or tertiary aryl ester groups, secondary or tertiary ester groups having a combination of alkyl and aryl groups, tertiary alkoxy groups, acetal groups, or ketal groups. Acid-labile groups are also commonly referred to in the art as "acid-cleavable groups," "acid-cleavable protecting groups," "acid-labile protecting groups," "acid-leaving groups," "acid-decomposable groups," and "acid-sensitive groups."

Disclosed herein is a photoresist composition that comprises a polymer comprising an acid labile group; a photoacid generator and an acid diffusion control agent that comprises a tri-alkyl amide compound having a lipophilicity (log P) value that is greater than 11. Each alkyl chain of the tri-alkyl functional groups may comprise a $C_7$ to $C_{20}$ alkyl that is substituted or unsubstituted and may be linear, cyclic or branched.

The use of linear or branched tri-alkyl substituted amide compounds in a photoresist can significantly enhance the profile of a relief image such as contact hole. In particular, the use of tri-alkyl substituted amide compounds, where each alkyl chain has 7 to 20 carbon atoms shows enhanced lithographic results when compared with other photoresists that contain amide complexes that have a shorter alkyl chain length, or other types of basic additives such as amine-containing compounds.

Lipophilicity, most commonly referred to as the Log P, represents the ratio at equilibrium of the concentration of a compound between two phases, an oil and a liquid phase. The Log P value is a constant defined in the following manner: Log P=log 10 (Partition Coefficient) Partition Coefficient, P=[organic]/[aqueous] where the square bracket parenthesis "[ ]" indicates the concentration of solute in the organic and aqueous partition.

The photoresist composition includes one or more matrix polymers comprising an acid labile group. The acid labile group is a chemical moiety that readily undergoes a deprotection reaction in the presence of an acid. The matrix polymer as part of a layer of the photoresist composition undergoes a change in solubility in a developer as a result of reaction with acid generated from the photoacid generator following softbake, exposure to activating radiation and post exposure bake. This results from photoacid-induced cleavage of the acid labile group, causing a change in polarity of the matrix polymer. The acid labile group can be chosen, for example, from tertiary alkyl carbonates, tertiary alkyl esters, tertiary alkyl ethers, acetals and ketals. Preferably, the acid labile group is an ester group that contains a tertiary non-cyclic alkyl carbon or a tertiary alicyclic carbon covalently linked to a carboxyl oxygen of an ester of the matrix polymer. The cleavage of such acid labile groups results in the formation of carboxylic acid groups.

Suitable acid labile-group containing units include, for example, acid-labile (alkyl)acrylate units, such as t-butyl (meth)acrylate, 1-methylcyclopentyl (meth)acrylate, 1-ethylcyclopentyl (meth)acrylate, 1-isopropylcyclopentyl (meth)acrylate, 1-propylcyclopentyl (meth)acrylate, 1-methylcyclohexyl (meth)acrylate, 1-ethylcyclohexyl (meth)acrylate, 1-isopropylcyclohexyl (meth)acrylate, 1-propylcyclohexyl (meth)acrylate, t-butyl methyladamantyl(meth)acrylate, ethylfenchyl(meth)acrylate, and the like, and other cyclic, including alicyclic, and non-cyclic (alkyl) acrylates. Acetal and ketal acid labile groups can be substituted for the hydrogen atom at the terminal of an alkali-soluble group such as a carboxyl group or hydroxyl group, so as to be bonded with an oxygen atom. When acid is generated, the acid cleaves the bond between the acetal or ketal group and the oxygen atom to which the acetal-type acid-dissociable, dissolution-inhibiting group is bonded. Exemplary such acid labile groups are described, for example, in U.S. Pat. Nos. U.S. Pat. Nos. 6,057,083, 6,136, 501 and 8,206,886 and European Pat. Pub. Nos. EP01008913A1 and EP00930542A1. Also suitable are acetal and ketal groups as part of sugar derivative structures, the cleavage of which would result in the formation of hydroxyl groups, for example, those described in U.S. Patent Application No. US2012/0064456A1.

For wavelengths of 200 nm or greater such as 248 nm, suitable resin materials include, for example, phenolic resins that contain acid-labile groups. Particularly preferred resins of this class include: (i) polymers that contain polymerized units of a vinyl phenol and an acid labile (alkyl) acrylate as described above, such as polymers described in U.S. Pat. Nos. 6,042,997 and 5,492,793; (ii) polymers that contain polymerized units of a vinyl phenol, an optionally substituted vinyl phenyl (e.g., styrene) that does not contain a hydroxy or carboxy ring substituent, and an acid labile (alkyl) acrylate such as described above, such as polymers described in U.S. Pat. No. 6,042,997; (iii) polymers that contain repeat units that comprise an acetal or ketal moiety that will react with photoacid, and optionally aromatic repeat units such as phenyl or phenolic groups; such polymers described in U.S. Pat. Nos. 5,929,176 and 6,090,526, and blends of (i) and/or (ii) and/or (iii).

For imaging at certain sub-200 nm wavelengths such as 193 nm, the matrix polymer is typically substantially free (e.g., less than 15 mole %), preferably completely free of phenyl, benzyl or other aromatic groups where such groups are highly absorbing of the radiation. Suitable polymers that are substantially or completely free of aromatic groups are disclosed in European Patent Publication No. EP930542A1 and U.S. Pat. Nos. 6,692,888 and 6,680,159.

Other suitable matrix polymers include, for example, those which contain polymerized units of a non-aromatic cyclic olefin (endocyclic double bond) such as an optionally substituted norbornene, for example, polymers described in U.S. Pat. Nos. 5,843,624 and 6,048,664. Still other suitable matrix polymers include polymers that contain polymerized anhydride units, particularly polymerized maleic anhydride and/or itaconic anhydride units, such as disclosed in European Published Application EP01008913A1 and U.S. Pat. No. 6,048,662.

Also suitable as the matrix polymer is a resin that contains repeat units that contain a hetero atom, particularly oxygen and/or sulfur (but other than an anhydride, i.e., the unit does not contain a keto ring atom). The heteroalicyclic unit can be fused to the polymer backbone and can comprise a fused carbon alicyclic unit such as provided by polymerization of a norbornene group and/or an anhydride unit such as provided by polymerization of a maleic anhydride or itaconic anhydride. Such polymers are disclosed in International Pub. No. WO0186353A1 and U.S. Pat. No. 6,306,554. Other suitable hetero-atom group containing matrix polymers include polymers that contain polymerized carbocyclic aryl units substituted with one or more hetero-atom (e.g., oxygen or sulfur) containing groups, for example, hydroxy naphthyl groups, such as disclosed in U.S. Pat. No. 7,244,542.

In the case of sub-200 nm wavelengths such as 193 nm and EUV (e.g., 13.5 nm), the matrix polymer typically further includes a unit containing a lactone moiety for controlling the dissolution rate of the matrix polymer and photoresist composition. Suitable monomers for use in the matrix polymer containing a lactone moiety include, for example, the following:

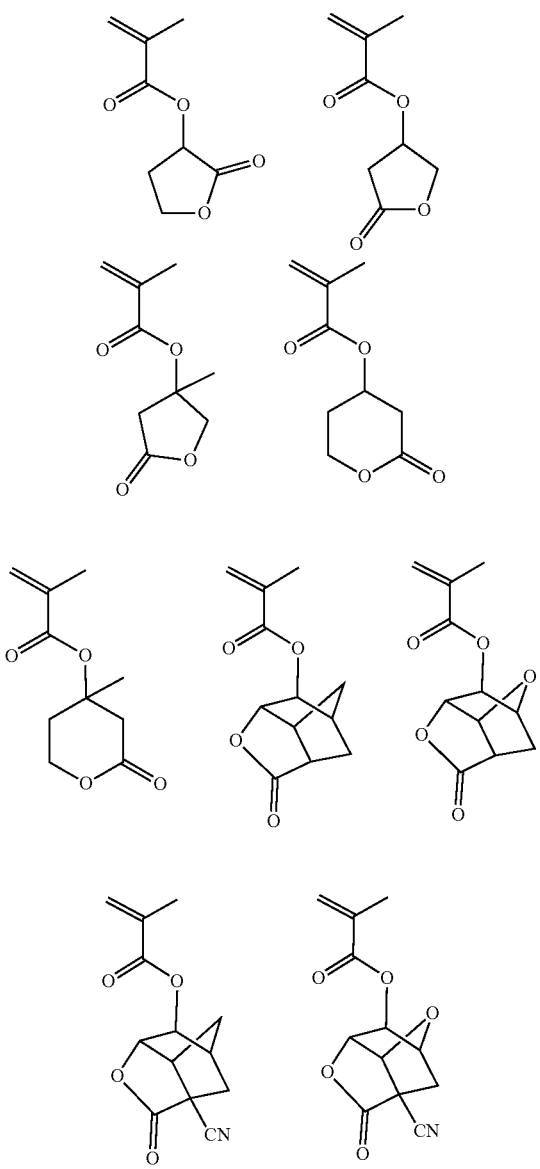

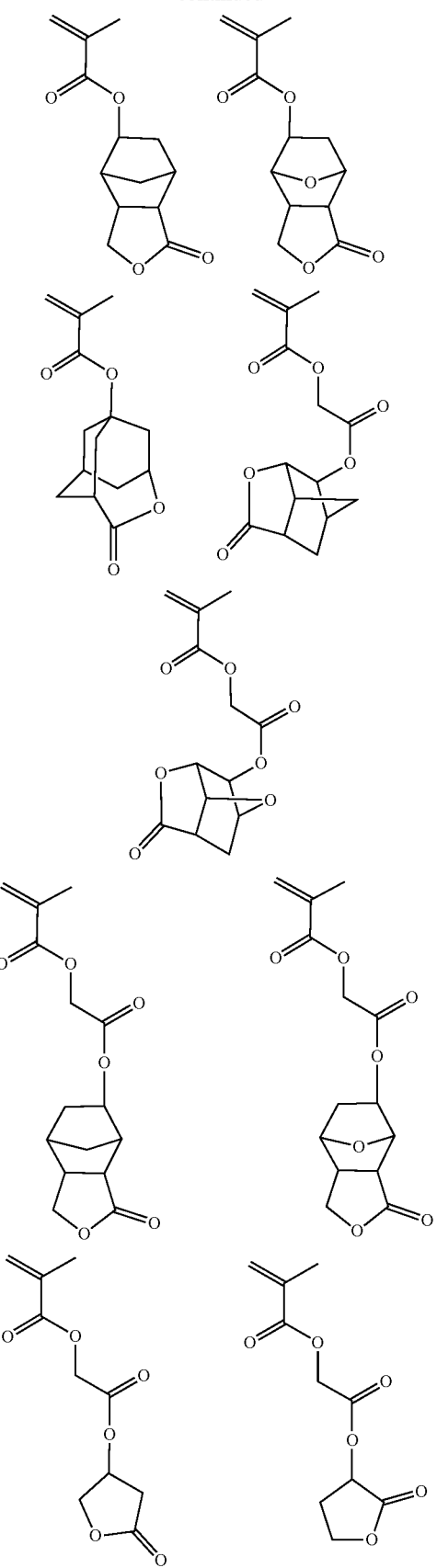
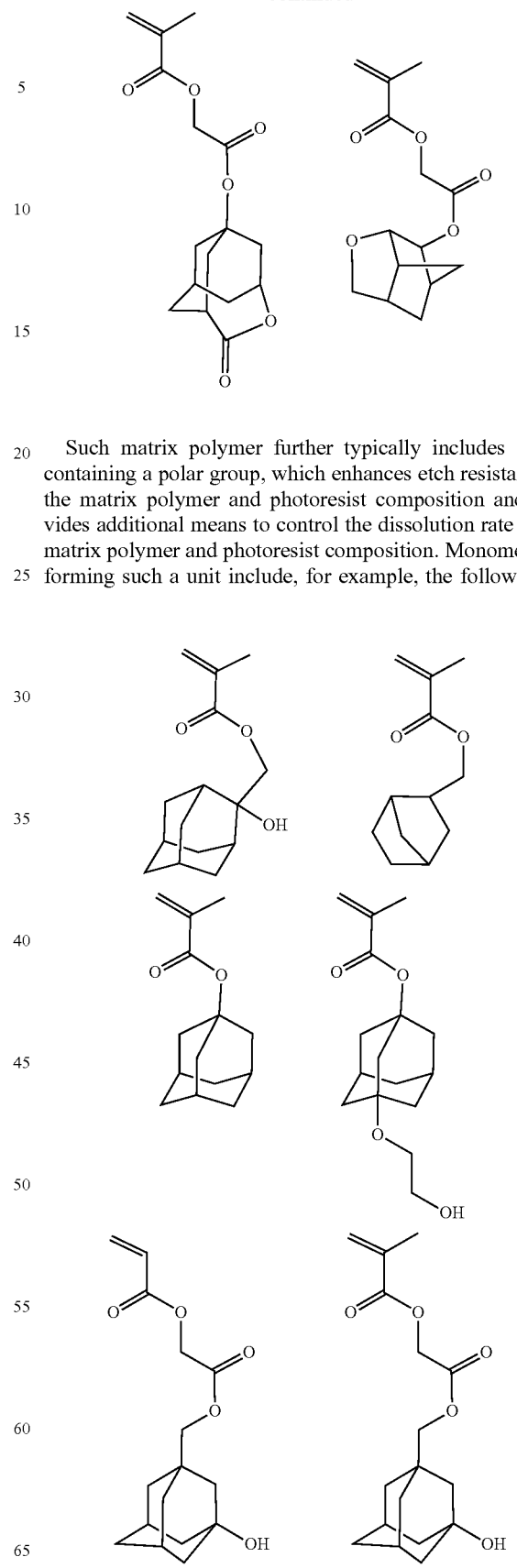
Such matrix polymer further typically includes a unit containing a polar group, which enhances etch resistance of the matrix polymer and photoresist composition and provides additional means to control the dissolution rate of the matrix polymer and photoresist composition. Monomers for forming such a unit include, for example, the following:

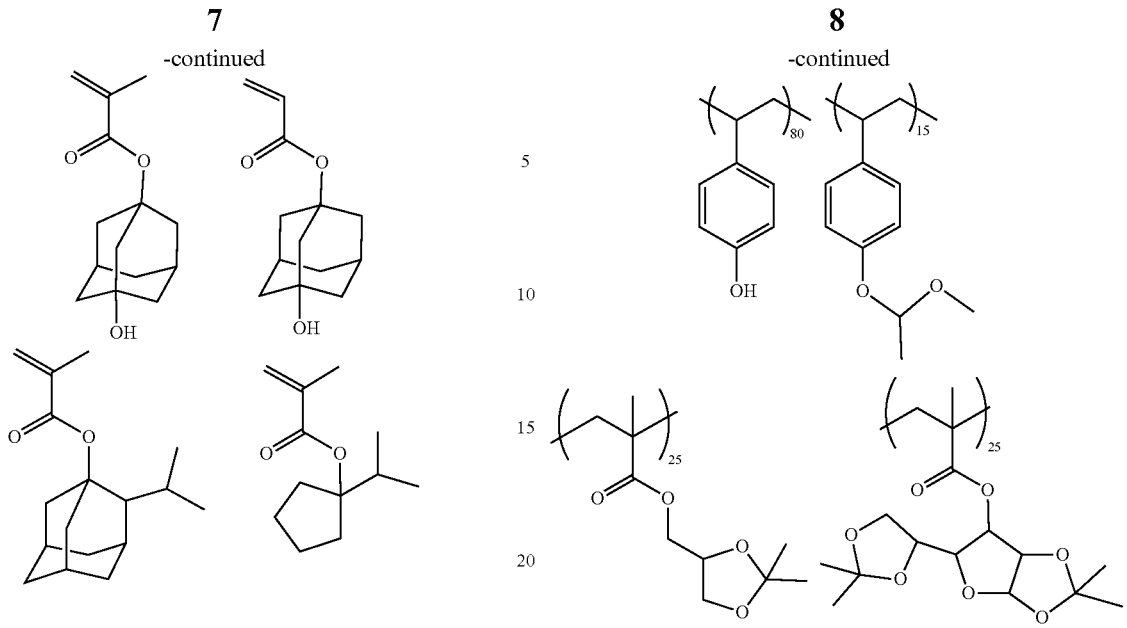

The matrix polymer can include one or more additional units of the types described above. Typically, the additional units for the matrix polymer will include the same or similar polymerizable group as those used for the monomers used to form the other units of the polymer, but may include other, different polymerizable groups in the same polymer backbone.

The matrix polymer has a higher surface energy than that of the additive polymer, described below, and should be substantially non-miscible with the additive polymer. As a result of the difference in surface energies, segregation of the additive polymer from the matrix polymer takes place during spin-coating. A suitable surface energy of the matrix polymer is typically from 20 to 50 mN/m, preferably from 30 to 40 mN/m.

While not to be limited thereto, exemplary matrix polymers include, for example, the following:

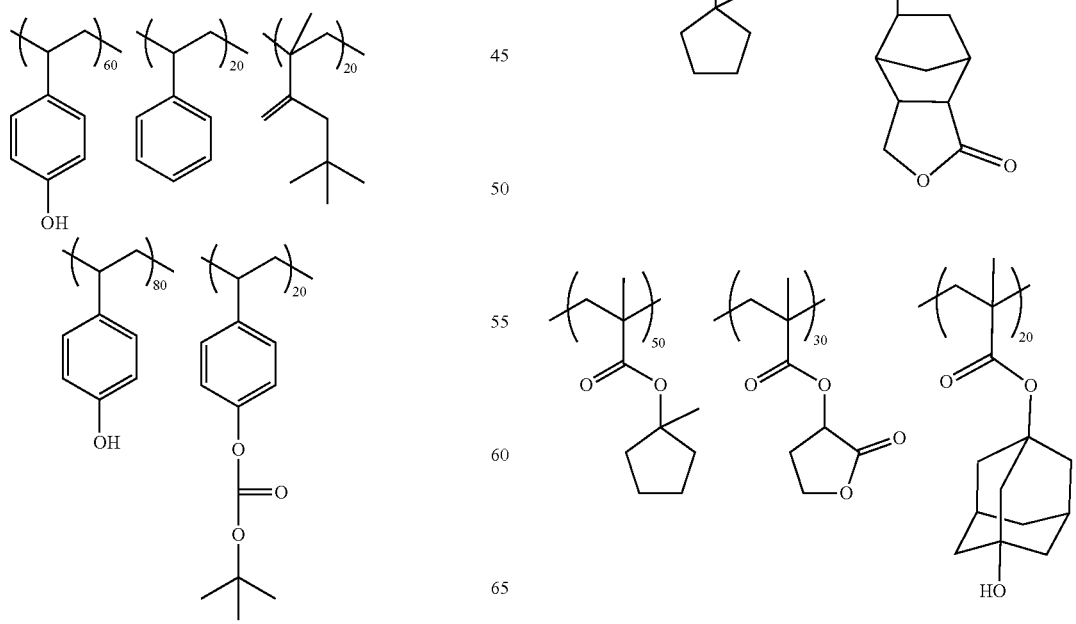

-continued
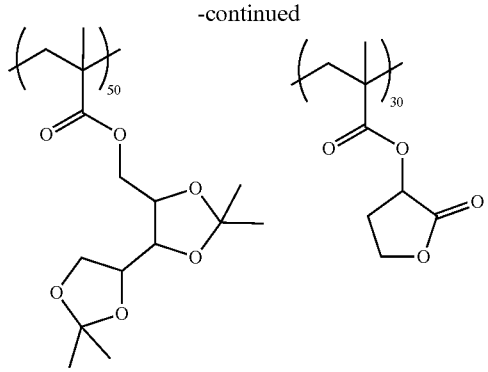
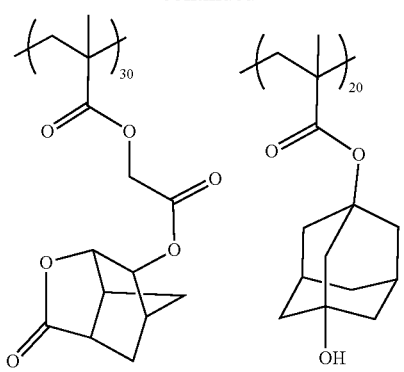
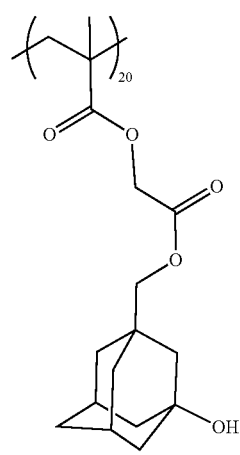
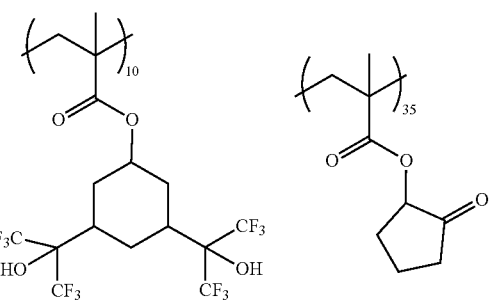
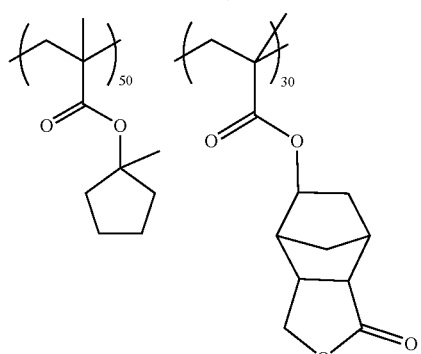
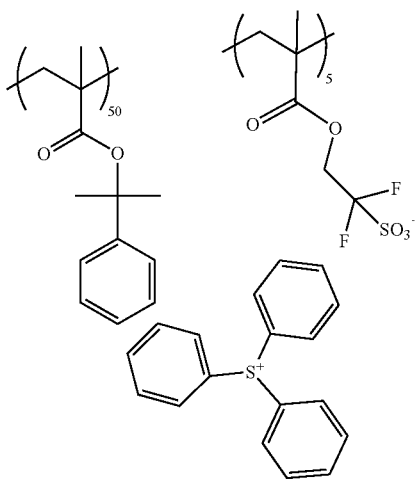
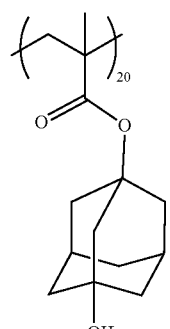
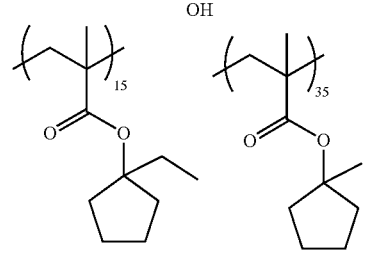
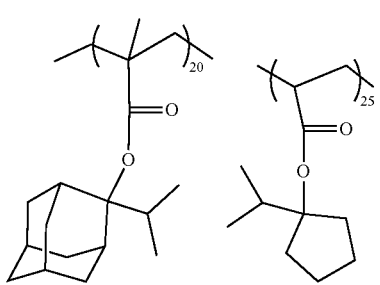

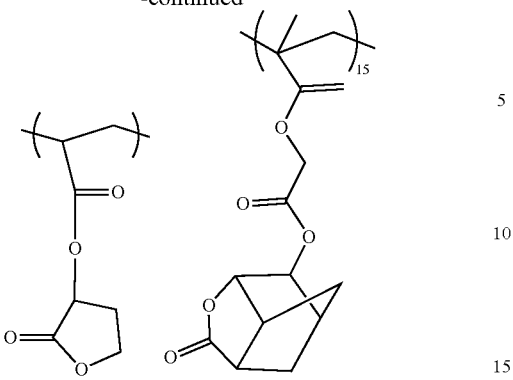
Other exemplary copolymers that may be used as the first polymer include, for example, the following:
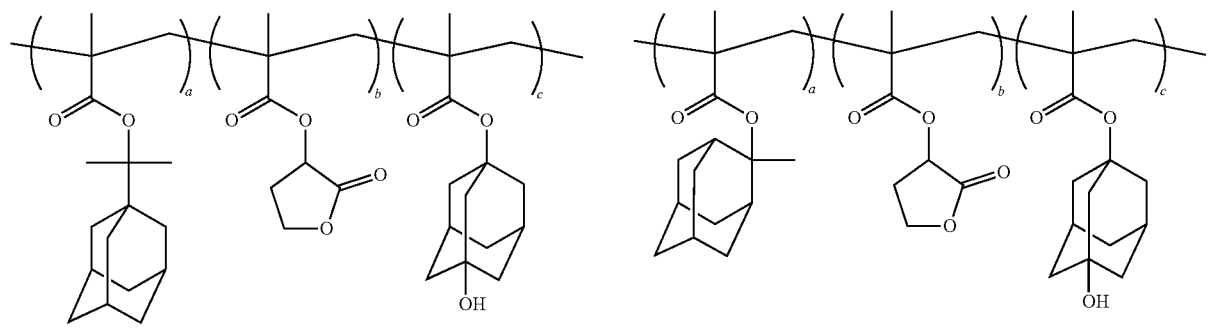
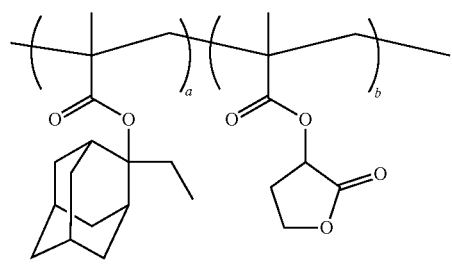
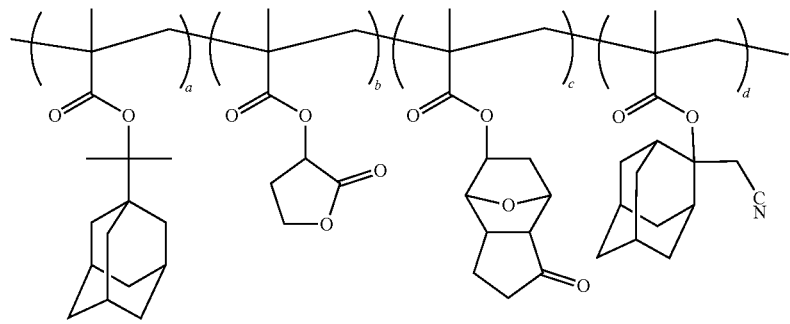

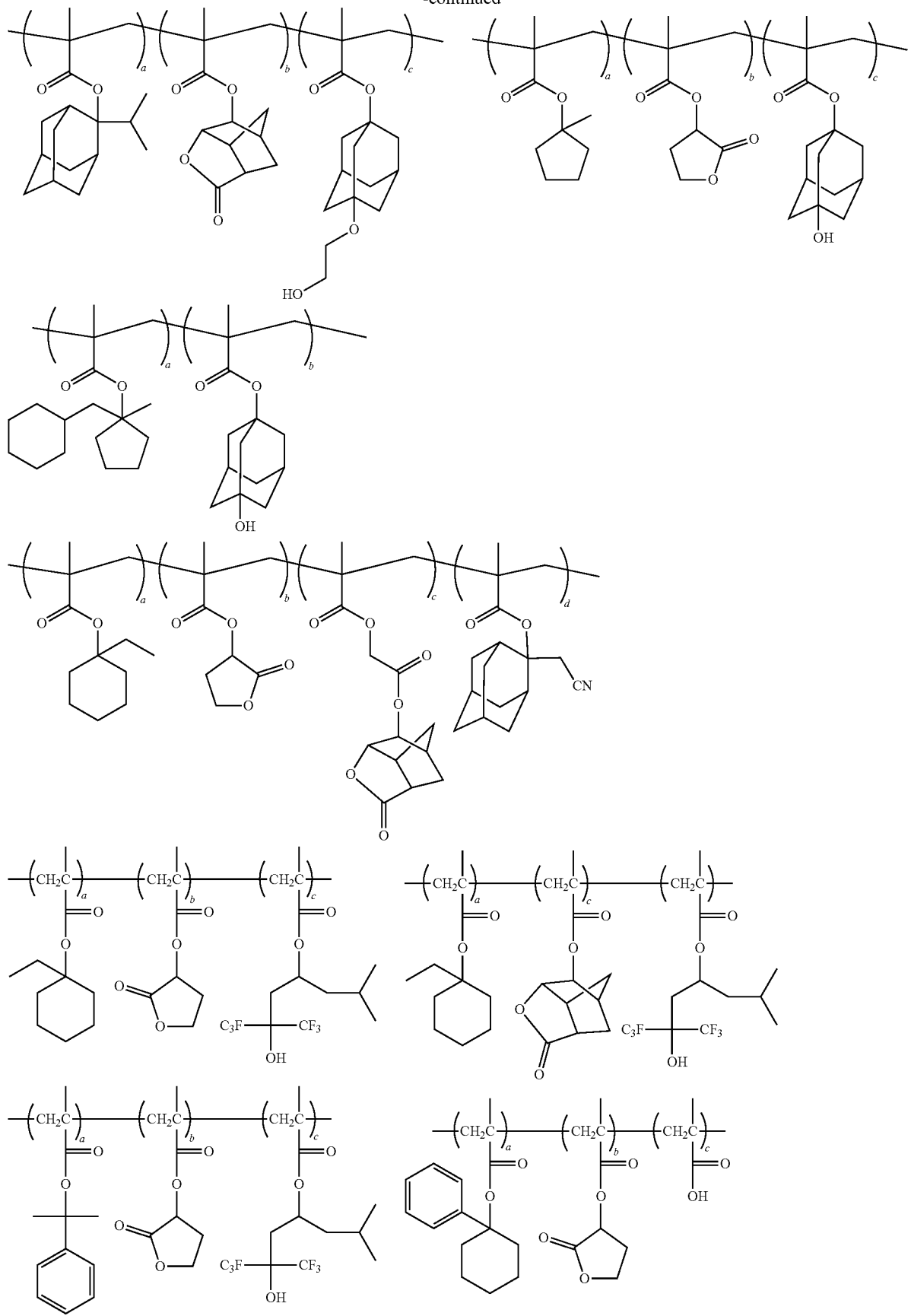

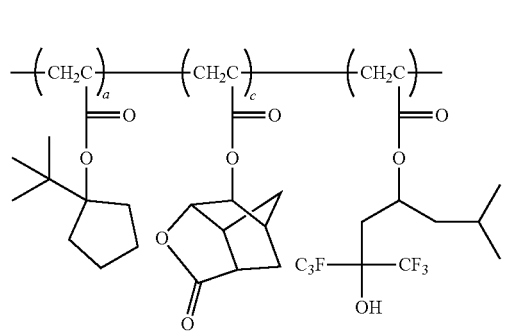
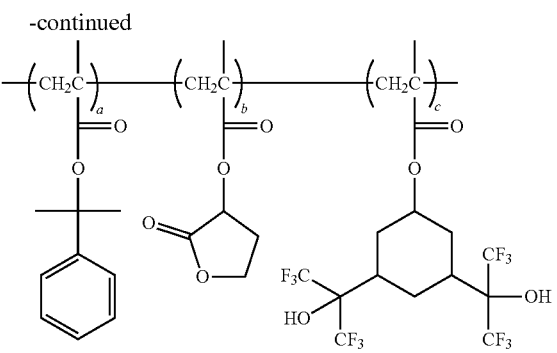
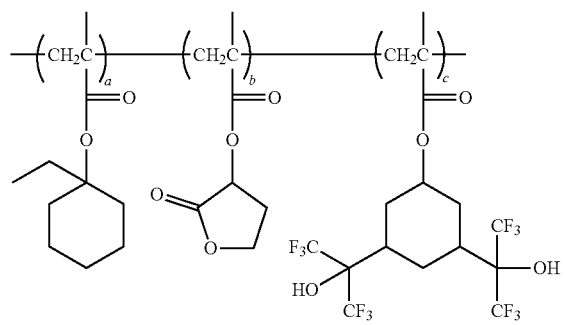
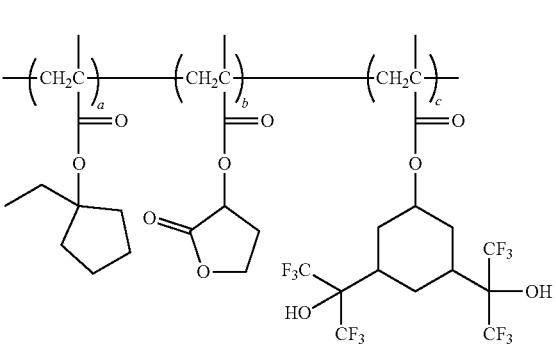
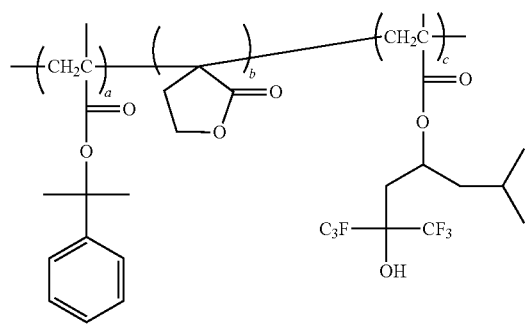
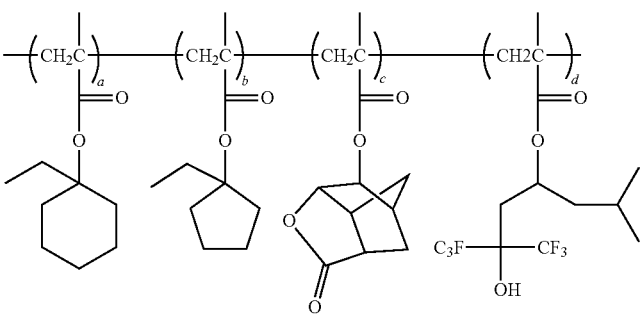
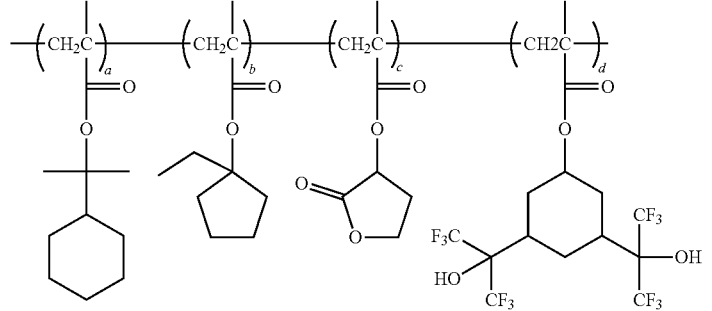
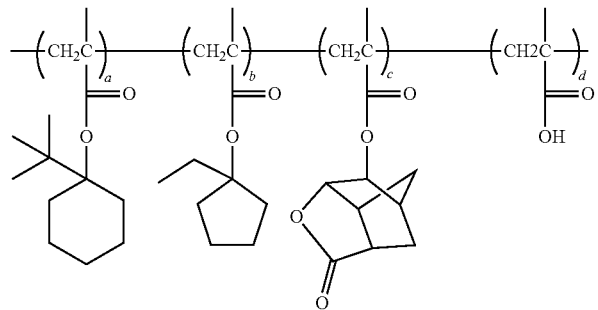

-continued

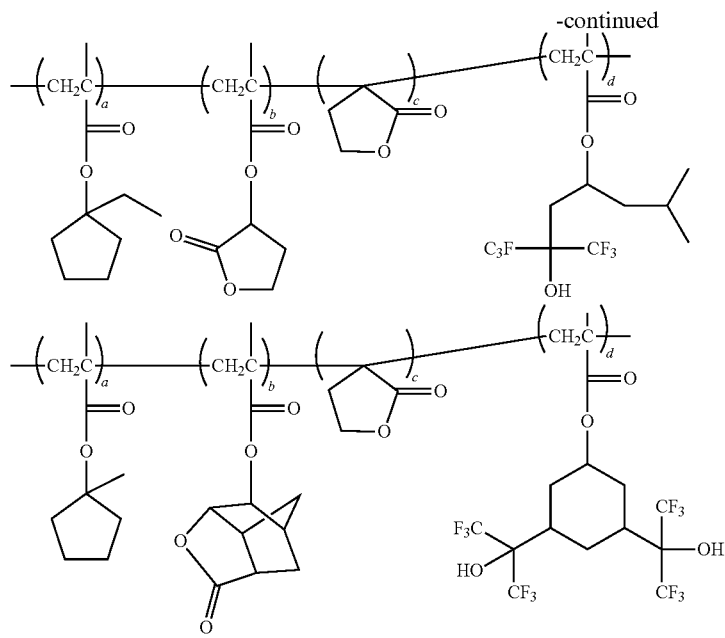

Suitable matrix polymers for use in the photoresist compositions of the invention are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 70 to 95 wt % based on total solids of the resist composition. The weight average molecular weight Mw of the matrix polymer is typically less than 100,000, for example, from 4000 to 100,000, more typically from 4000 to 15,000. Blends of two or more of the above-described matrix polymers can suitably be used in the photoresist compositions of the invention.

The photosensitive composition further comprises a photoacid generator (PAG) employed in an amount sufficient to generate a latent image in a coating layer of the composition upon exposure to activating radiation. For example, the photoacid generator will suitably be present in an amount of from about 1 to 30 wt % based on total solids of the photoresist composition. Typically, lesser amounts of the photoactive component will be suitable for chemically amplified resists.

The photoresist compositions further include one or more photoacid generators (PAGs). Suitable photoacid generator compounds may have formula $G^+A^-$, wherein $G^+$ is an organic cation and $A^-$ is an organic anion typically comprising a sulfonate, an anion of a sulfonamide, an anion of a sulfonimide, or a methide anion. Suitable organic anions include, for example, fluoroalkyl and alkylsulfonate, fluorocycloalkyl and cycloalkylsulfonate.

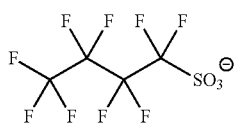

-continued

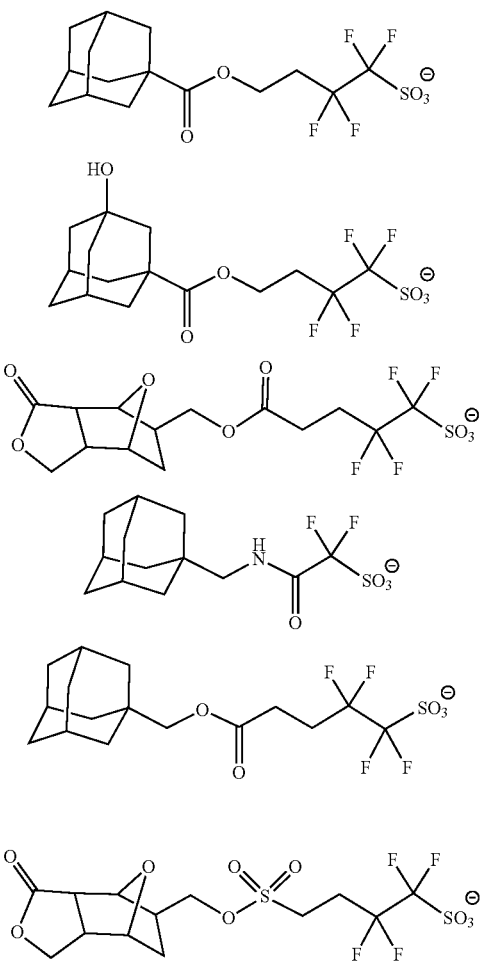

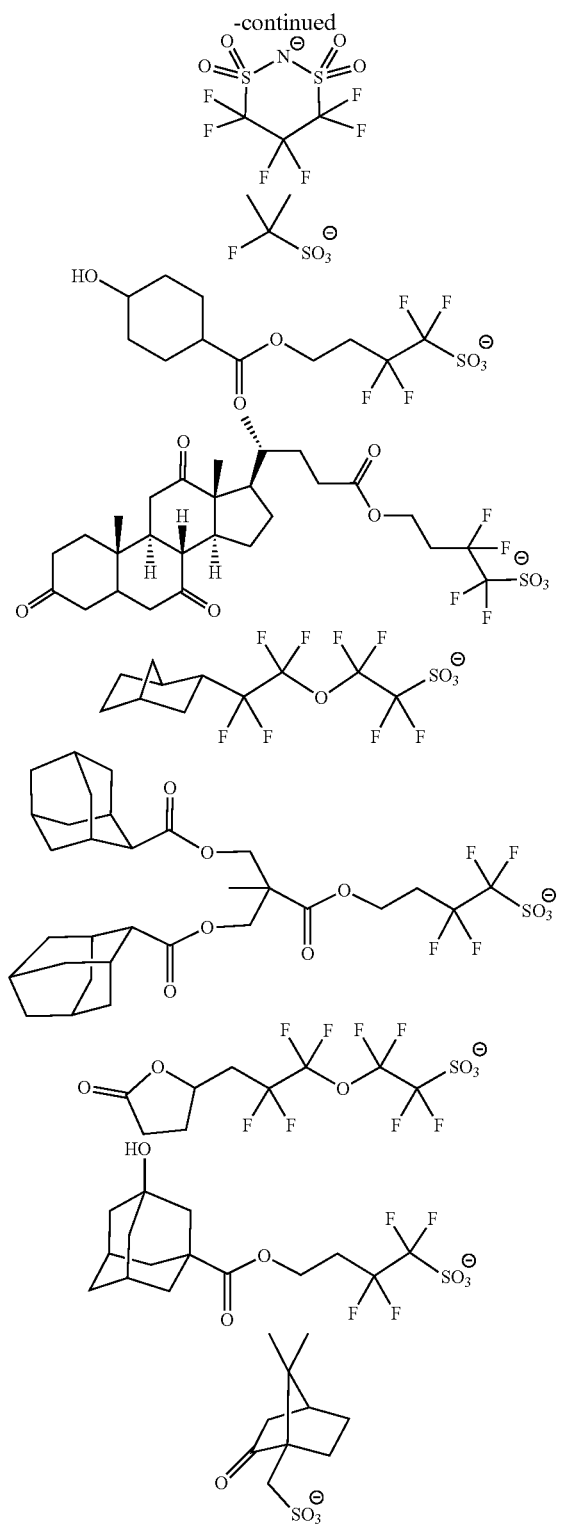

groups, or a combination of alkyl and aryl groups. In some embodiments, G+ is a substituted sulfonium cation having the formula (2A):

(2A)

wherein, each $R^{aa}$ is independently a $C_{1-20}$ alkyl group, a $C_{1-20}$ fluoroalkyl group, a $C_{3-20}$ cycloalkyl group, a $C_{3-20}$ fluorocycloalkyl group, a $C_{2-20}$ alkenyl group, a $C_{2-20}$ fluoroalkenyl group, a $C_{6-30}$ aryl group, a $C_{6-30}$ fluoroaryl group, $C_{6-30}$ iodoaryl group, a $C_{1-30}$ heteroaryl group, a $C_{7-20}$ arylalkyl group, a $C_{7-20}$ fluoroarylalkyl group, a $C_{2-20}$ heteroarylalkyl group, or a $C_{2-20}$ fluoroheteroarylalkyl group, each of which is substituted or unsubstituted, wherein each $R^{aa}$ is either separate or connected to another group R aa via a single bond or a divalent linking group to form a ring. Each W a optionally may include as part of its structure one or more groups selected from —O—, —C(O)—, —C(O)—O—, —$C_{1-12}$ hydrocarbylene-, —O—($C_{1-12}$ hydrocarbylene)-, —C(O)—O—($C_{1-12}$ hydrocarbylene)-, and —C(O)—O—($C_{1-12}$ hydrocarbylene)-O—. Each $R^{aa}$ independently may optionally comprise an acid-labile group chosen, for example, from tertiary alkyl ester groups, secondary or tertiary aryl ester groups, secondary or tertiary ester groups having a combination of alkyl and aryl groups, tertiary alkoxy groups, acetal groups, or ketal groups. Suitable divalent linking groups for connection of $R^{aa}$ groups include, for example, —O—, —S—, —Te—, —Se—, —C(O)—, —C(S)—, —C(Te)—, or —C(Se)—, substituted or unsubstituted $C_{1-5}$ alkylene, and combinations thereof.

Exemplary sulfonium cations of formula (2A) include the following:

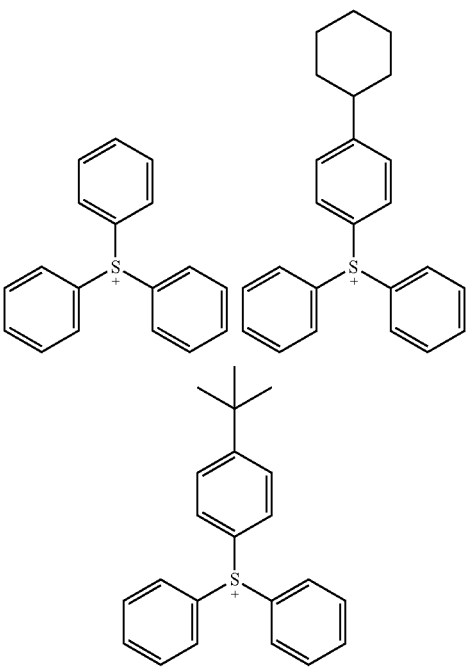

Suitable organic cations include, for example, iodonium cations substituted with two alkyl groups, aryl groups, or a combination of alkyl and aryl groups; and sulfonium cations substituted with three alkyl groups, aryl groups, or a combination of alkyl and aryl groups. In some embodiments, G+ is an iodonium cation substituted with two alkyl groups, aryl groups, or a combination of alkyl and aryl groups; or a sulfonium cation substituted with three alkyl groups, aryl

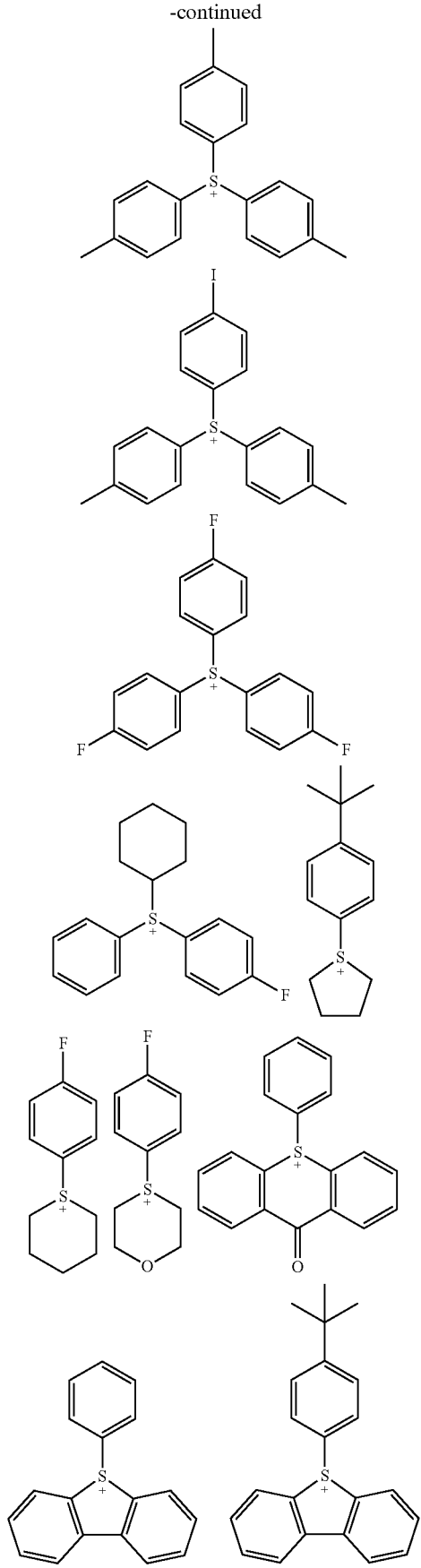
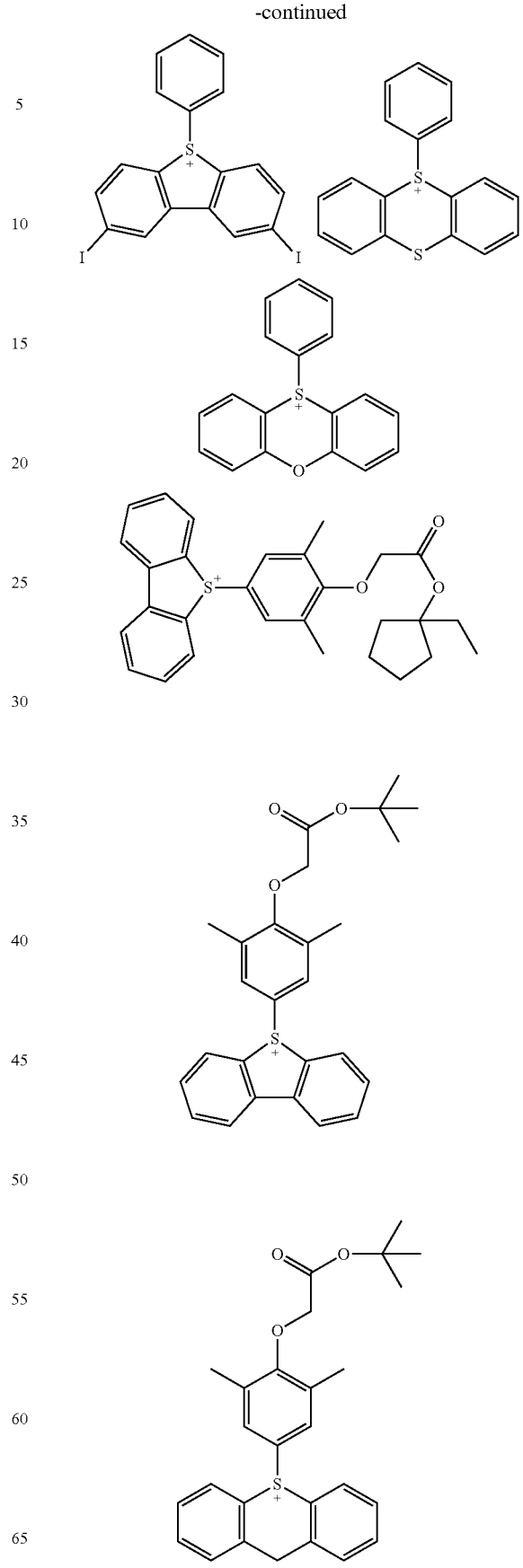

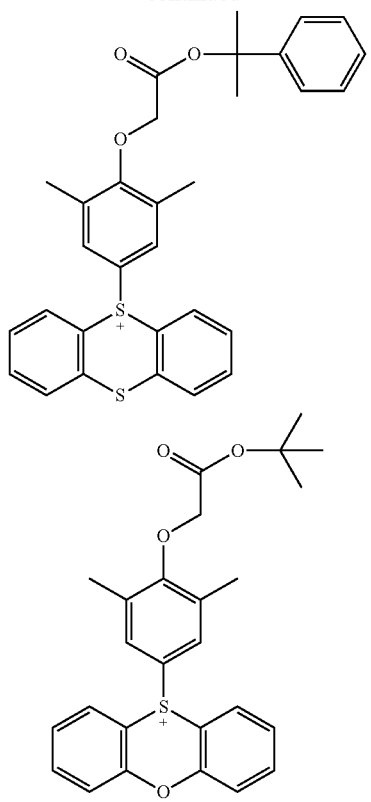

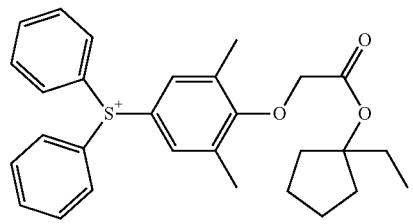

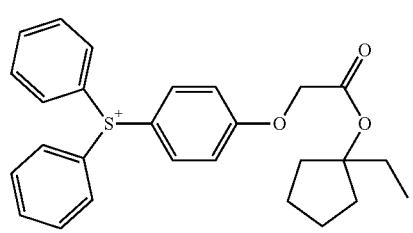

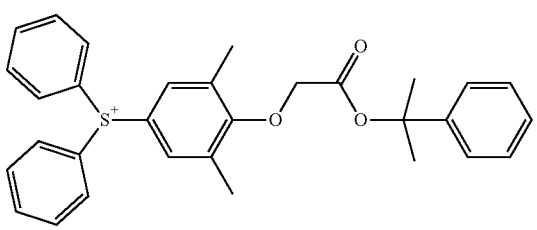

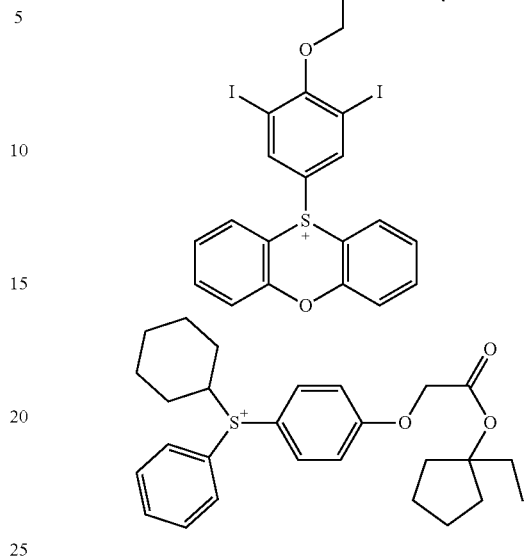

Suitable PAGs include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl p-toluenesulfonate, 2,6-dinitrobenzyl p-toluenesulfonate, and 2,4-dinitrobenzyl p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenensulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable photoacid generators are further described in U.S. Pat. No. 8,431,325 to Hashimoto et al. in column 37, lines 11-47 and columns 41-91. Other suitable sulfonate PAGS include sulfonated esters and sulfonyloxy ketones, nitrobenzyl esters, s-triazine derivatives, benzoin tosylate, t-butylphenyl α-(p-toluenesulfonyloxy)-acetate, and t-butyl α-(p-toluenesulfonyloxy)-acetate; as described in U.S. Pat. Nos. 4,189,323 and 8,431,325. Typically, the photoacid generator is present in the photoresist composition in an amount of from 1 to 30 wt %, more typically 5 to 27 wt %, and more preferably 8 to 25 wt %, based on total solids of the photoresist composition.

Suitable solvents for the photoresist compositions of the invention include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; cellosolve esters such as methyl cellosolve acetate; aromatic hydrocarbons such as toluene and xylene; and ketones such as methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

Other optional additives for the photoresist compositions include, for example, actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition, although fillers and dyes can be present in relatively large concentrations, for example, from 5 to 30 wt % based on total solids of the photoresist composition.

A preferred optional additive of resist compositions of the invention is an added base which can enhance resolution of a developed resist relief image. Suitable basic quenchers include, for example: linear and cyclic amides and derivatives thereof such as N,N-bis(2-hydroxyethyl)pivalamide, N,N-diethylacetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl) amine, 2,2',2'',2'''-(ethane-1,2-diylbis(azanetriyl))tetraethanol, and 2-(dibutylamino)ethanol, 2,2',2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl) morpholine. Of these basic quenchers, 1-(tert-butoxycarbonyl)-4-hydroxypiperidine and triisopropanolamine are preferred. The added base is suitably used in relatively small amounts, for example, from 1 to 30 wt % relative to the PAG, more typically from 5 to 15 wt % relative to the PAG.

The photoresist composition also comprises an acid diffusion control agent that comprises a tri-alkyl amide compound having a lipophilicity (log P) value that is greater than 11, greater than 12, greater than 13 and greater than 15. The tri-alkyl amide compound has the structure of formula (1)

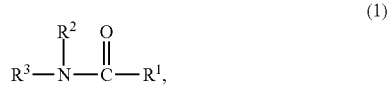

(1)

where at least one of $R^1$, $R^2$ and $R^3$ are independently linear, cyclic or branched $C_7$ to $C_{20}$ alkyl groups that may be substituted or unsubstituted. In one embodiment, preferably each of $R^1$, $R^2$ and $R^3$ is independently a linear, cyclic or branched $C_7$ to $C_{20}$ alkyl group that may be substituted or unsubstituted. Substituted alkyl groups are those where at least one alkylene group is substituted by N, S or O.

In an embodiment, $R^1$, $R^2$ or $R^3$ may independently be an alkyl having 7 to 15 carbon atoms, a cycloalkyl having 7 to 15 carbon atoms, an alkyl having 7 to 15 carbon atoms in which at least one —$CH_2$— is substituted by N, S or O.

In an embodiment, $R^1$, $R^2$ and $R^3$ are alkyl groups or cycloalkyl groups having the same or different numbers of carbon atoms. In an embodiment, $R^1$ has a different number of carbon atoms than either $R^2$ or $R^3$, while $R^2$ and $R^3$ have the same number of carbon atoms. In an embodiment, $R^1$ is a linear or branched alkyl or a cycloalkyl having 7 to 13 carbon atoms, whereas $R^2$ and $R^3$ are each linear or branched alkyls or cycloalkyls having the same number of carbon atoms. In an embodiment, $R^2$ and $R^3$ are linear or branched alkyls or cycloalkyls each having the same number of 7 to 15 carbon atoms, preferably 8 to 13 carbon atoms. In an embodiment, $R^1$ is a linear or branched alkyl or cycloalkyl having an odd number of carbon atoms while $R^2$ and $R^3$ are linear or branched alkyls or cycloalkyls having an even number of carbon atoms.

The tri-alkyl amide compound is present in the photoresist composition in an amount of from 0.3 to 5 wt %, more typically from 0.8 to 2 wt %, based on total solids of the photoresist composition.

The photoresists used in accordance with the invention are generally prepared following known procedures. For example, a resist of the invention can be prepared as a coating composition by dissolving the components of the photoresist in a suitable solvent, for example, one or more of: a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl cellosolve acetate; an aromatic hydrocarbon such toluene or xylene; or a ketone such as methylethyl ketone, cyclohexanone and 2-heptanone. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

The photoresist composition may further include one or more additional, optional additives. For example, optional additives may include one or more photo-decomposable quenchers (also known as photo-decomposable bases), basic quenchers in addition to the diamide quencher compounds described above, surfactants, resist stabilizers, actinic and contrast dyes, anti-striation agents, plasticizers, speed enhancers, sensitizers, and the like, or combinations thereof. If not otherwise stated below, the optional additives are typically present in the photoresist compositions in an amount of from 0.01 to 10 wt %, based on total solids of the photoresist composition.

Photo-decomposable quenchers generate a weak acid upon irradiation. The acid generated from a photo-decomposable quencher is not strong enough to react rapidly with acid-labile groups that are present in the resist matrix. Exemplary photo-decomposable quenchers include, for example, photo-decomposable cations, and preferably those also useful for preparing strong acid generator compounds but paired with an anion of a weak acid (pKa>1) such as, for example, a $C_{1-20}$ carboxylic acid or $C_{1-20}$ sulfonic acid. Exemplary carboxylic acids include formic acid, acetic acid, propionic acid, tartaric acid, succinic acid, cyclohexanecarboxylic acid, benzoic acid, salicylic acid, and the like. Exemplary carboxylic acids include p-toluene sulfonic acid, camphor sulfonic acid and the like. In a preferred embodiment, the photo-decomposable quencher is a photo-decomposable organic zwitterion compound such as diphenyliodonium-2-carboxylate.

Exemplary basic quenchers include, for example: linear aliphatic amines such as tributylamine, trioctylamine, triisopropanolamine, tetrakis(2-hydroxypropyl)ethylenediamine:

n-tert-butyldiethanolamine, tris(2-acetoxy-ethyl) amine, 2,2',2",2'''-(ethane-1,2-diylbis(azanetriyl))tetraethanol, 2-(dibutylamino)ethanol, and 2,2',2"-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate, and N-(2-acetoxy-ethyl) morpholine; aromatic amines such as pyridine, di-tert-butyl pyridine, and pyridinium; linear and cyclic amides and derivatives thereof such as N,N-bis(2-hydroxyethyl)pivalamide, N,N-diethylacetamide, $N^1,N^1,N^3,N^3$-tetrabutylmalonamide, 1-methylazepan-2-one, 1-allylazepan-2-one, and tert-butyl 1,3-dihydroxy-2-(hydroxymethyl)propan-2-ylcarbamate; ammonium salts such as quaternary ammonium salts of sulfonates, sulfamates, carboxylates, and phosphonates; imines such as primary and secondary aldimines and ketimines; diazines such as optionally substituted pyrazine, piperazine, and phenazine; diazoles such as optionally substituted pyrazole, thiadiazole, and imidazole; and optionally substituted pyrrolidones such as 2-pyrrolidone and cyclohexyl pyrrolidine.

Exemplary surfactants include fluorinated and non-fluorinated surfactants and can be ionic or non-ionic, with non-ionic surfactants being preferable. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova. In an aspect, the photoresist composition further includes a surfactant polymer including a fluorine-containing repeating unit.

The photoresist compositions can be prepared following known procedures. For example, the compositions can be prepared by dissolving solid (non-solvent) components of the composition in the solvent component(s).

Patterning methods using the photoresist compositions of the invention will now be described. Suitable substrates on which the photoresist compositions can be coated include electronic device substrates. A wide variety of electronic device substrates may be used in the present invention, such as: semiconductor wafers; polycrystalline silicon substrates; packaging substrates such as multichip modules; flat panel display substrates; substrates for light emitting diodes (LEDs) including organic light emitting diodes (OLEDs); and the like, with semiconductor wafers being typical. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. Such substrates may be any suitable size. Typical wafer substrate diameters are 200 to 300 millimeters (mm), although wafers having smaller and larger diameters may be suitably employed according to the present invention. The substrates may include one or more layers or structures which may optionally include active or operable portions of devices being formed.

Typically, one or more lithographic layers such as a hardmask layer, for example, a spin-on-carbon (SOC), amorphous carbon, or metal hardmask layer, a CVD layer such as a silicon nitride (SiN), a silicon oxide (SiO), or silicon oxynitride (SiON) layer, an organic or inorganic underlayer, or combinations thereof, are provided on an upper surface of the substrate prior to coating a photoresist composition of the present invention. Such layers, together with an overcoated photoresist layer, form a lithographic material stack.

Optionally, a layer of an adhesion promoter may be applied to the substrate surface prior to coating the photoresist compositions. If an adhesion promoter is desired, any suitable adhesion promoter for polymer films may be used, such as silanes, typically organosilanes such as trimethoxyvinylsilane, triethoxyvinylsilane, hexamethyldisilazane, or an aminosilane coupler such as gamma-aminopropyltriethoxysilane. Particularly suitable adhesion promoters include those sold under the AP 3000, AP 8000, and AP 9000S designations, available from DuPont Electronics & Imaging (Marlborough, Massachusetts).

The photoresist composition may be coated on the substrate by any suitable method, including spin coating, spray coating, dip coating, doctor blading, or the like. For example, applying the layer of photoresist may be accomplished by spin coating the photoresist in solvent using a coating track, in which the photoresist is dispensed on a spinning wafer. During dispensing, the wafer is typically spun at a speed of up to 4,000 rotations per minute (rpm), for example, from 200 to 3,000 rpm, for example, 1,000 to 2,500 rpm, for a period of from 15 to 120 seconds to obtain a layer of the photoresist composition on the substrate. The thickness of the coated layer may be adjusted by changing the spin speed and/or the solids content of the composition. A thickness of the photoresist layer formed from the compositions of the invention can vary widely depending on the application. For certain applications, the resist can have a dried layer thickness of from 10 to 400 nanometers (nm), preferably from 15 to 200 nm, and more preferably from 50 to 100 nm.

The photoresist composition is typically next soft-baked to minimize the solvent content in the layer, thereby forming a tack-free coating and improving adhesion of the layer to the substrate. The soft bake is performed, for example, on a hotplate or in an oven, with a hotplate being typical. The soft bake temperature and time will depend, for example, on the particular photoresist composition and thickness. The soft bake temperature is typically from 70 to 170° C., for example, from 70 to 150° C. The soft bake time is typically from 10 seconds to 20 minutes, for example, from 1 minute to 10 minutes, or from 1 minute to 5 minutes. The heating time can be readily determined by one of ordinary skill in the art based on the ingredients of the composition.

The photoresist layer is next pattern-wise exposed to activating radiation to create a difference in solubility between exposed and unexposed regions. Reference herein to exposing a photoresist composition to radiation that is activating for the composition indicates that the radiation is capable of forming a latent image in the photoresist composition. The exposure is typically conducted through a patterned photomask that has optically transparent and optically opaque regions corresponding to regions of the resist layer to be exposed and unexposed, respectively. Such exposure may, alternatively, be conducted without a photomask in a direct writing method, typically used for e-beam lithography. The activating radiation typically has a wavelength of sub-400 nm, sub-300 nm or sub-200 nm, with 248 nm (KrF), 193 nm (ArF), and 13.5 nm (EUV) wavelengths or e-beam lithography being preferred. The methods find use in immersion or dry (non-immersion) lithography techniques. The exposure energy is typically from 1 to 200 millijoules per square centimeter ($mJ/cm^2$), preferably 10 to 100 mJ/cm² and more preferably 20 to 50 mJ/cm², dependent upon the exposure tool and components of the photoresist composition.

Following exposure of the photoresist layer, a post-exposure bake (PEB) of the exposed photoresist layer is performed. The PEB can be conducted, for example, on a hotplate or in an oven, with a hotplate being typical. Conditions for the PEB will depend, for example, on the particular photoresist composition and layer thickness. The PEB is typically conducted at a temperature of from 80 to 150° C., and a time of from 30 to 120 seconds. A latent image defined by the polarity-switched (exposed regions) and unswitched regions (unexposed regions) is formed in the photoresist.

The exposed photoresist layer is then developed with a suitable developer to selectively remove those regions of the layer that are soluble in the developer while the remaining insoluble regions form the resulting photoresist pattern relief image. In the case of a positive-tone development (PTD) process, the exposed regions of the photoresist layer are removed during development and unexposed regions remain. Conversely, in a negative-tone development (NTD) process, the exposed regions of the photoresist layer remain, and unexposed regions are removed during development. Application of the developer may be accomplished by any suitable method such as described above with respect to application of the photoresist composition, with spin coating being typical. The development time is for a period effective to remove the soluble regions of the photoresist, with a time of from 5 to 60 seconds being typical. Development is typically conducted at room temperature.

Suitable developers for a PTD process include aqueous base developers, for example, quaternary ammonium hydroxide solutions such as tetramethylammonium hydroxide (TMAH), preferably 0.26 normal (N) TMAH, tetraethylammonium hydroxide, tetrabutylammonium hydroxide, sodium hydroxide, potassium hydroxide, sodium carbonate, potassium carbonate, and the like. Suitable developers for an NTD process are organic solvent-based, meaning the cumulative content of organic solvents in the developer is 50 wt % or more, typically 95 wt % or more, 95 wt % or more, 98 wt % or more, or 100 wt %, based on total weight of the developer. Suitable organic solvents for the NTD developer include, for example, those chosen from ketones, esters, ethers, hydrocarbons, and mixtures thereof. The developer is typically 2-heptanone or n-butyl acetate.

A coated substrate may be formed from the photoresist compositions of the invention. Such a coated substrate includes: (a) a substrate having one or more layers to be patterned on a surface thereof; and (b) a layer of the photoresist composition over the one or more layers to be patterned.

The photoresist pattern may be used, for example, as an etch mask, thereby allowing the pattern to be transferred to one or more sequentially underlying layers by known etching techniques, typically by dry-etching such as reactive ion etching. The photoresist pattern may, for example, be used for pattern transfer to an underlying hardmask layer which, in turn, is used as an etch mask for pattern transfer to one or more layers below the hardmask layer. In another aspect, the photoresist pattern may be used as a mask for an ion implantation process, for example, for selectively introducing dopants into the substrate surface. If the photoresist pattern is not consumed during pattern transfer or implantation processes, it may be removed from the substrate by known techniques, for example, oxygen plasma ashing. The photoresist compositions may, when used in one or more such patterning processes, be used to fabricate semiconductor devices such as memory devices, processor chips (CPUs), graphics chips, optoelectronic chips, LEDs, OLEDs, as well as other electronic devices.

The photoresist compositions disclosed herein are exemplified by the following non-limiting examples.

EXAMPLES

Example 1

This example details the synthesis of a tri-alky substituted amide. Octanoyl chloride (17.6 g, 0.1 mol) was added dropwise into a solution of triethyl amine (Et₃N) (20.3 g, 0.3 mol) and dioctylamine (36.1 g, 0.15 mol) in dichloromethane (DCM) (250 ml) at 0° C. The reaction mixture was stirred for 6 h at room temperature. After stirring, the volatiles were removed under vacuum. Crude product was diluted with heptane and purified by silica filter. After removal of solvents, clear oil of trioctylamine (TOAm) was obtained. (28.4 g, Yield: 77%) This reaction is shown below.

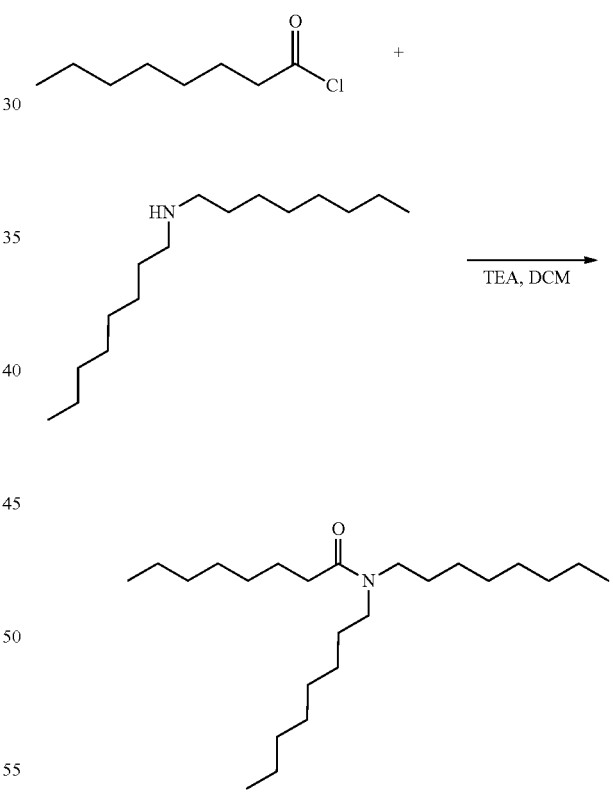

Synthesis of Myristoyl Dioctylamine (MDOAm)

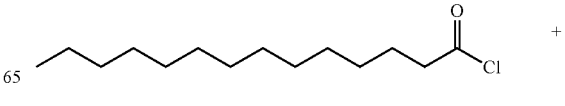

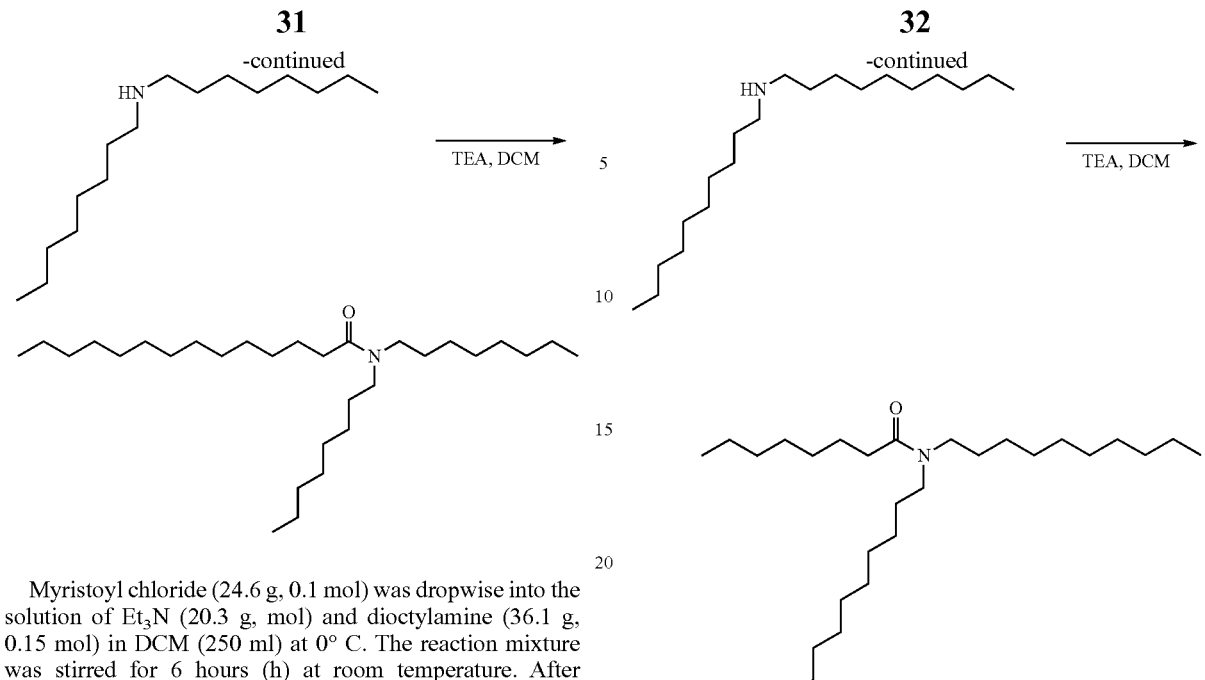

Myristoyl chloride (24.6 g, 0.1 mol) was dropwise into the solution of Et₃N (20.3 g, mol) and dioctylamine (36.1 g, 0.15 mol) in DCM (250 ml) at 0° C. The reaction mixture was stirred for 6 hours (h) at room temperature. After stirring, the volatiles were removed under vacuum. Crude product was diluted with heptane and purified by silica filter. After removal of solvents, clear oil of MDOAm was obtained. (40.1 g, Yield: 89%) The reaction is shown above.

Synthesis of Octanoyl Didecylamine (ODDAm)

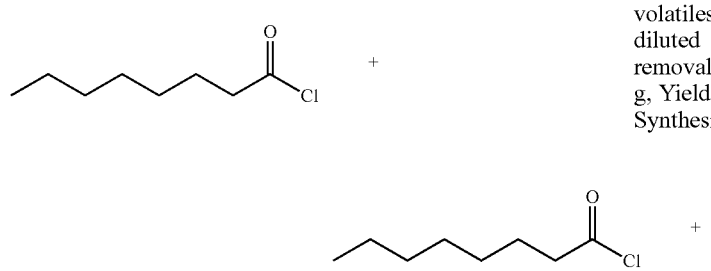

Octanoyl chloride (3.5 g, 20 mmol) was dropwise into the solution of Et₃N (2.5 g, mmol) and didecylamine (5.95 g, 20 mmol) in DCM (30 ml) at 0° C. The reaction mixture was stirred for 6 h at room temperature. After stirring, the volatiles were removed under vacuum. Crude product was diluted with heptane and purified by silica filter. After removal of solvents, clear oil of ODDAm was obtained. (6.9 g, Yield: 81%) The reaction is shown above.

Synthesis of Octanoyl Didodecylamine (ODDDAm)

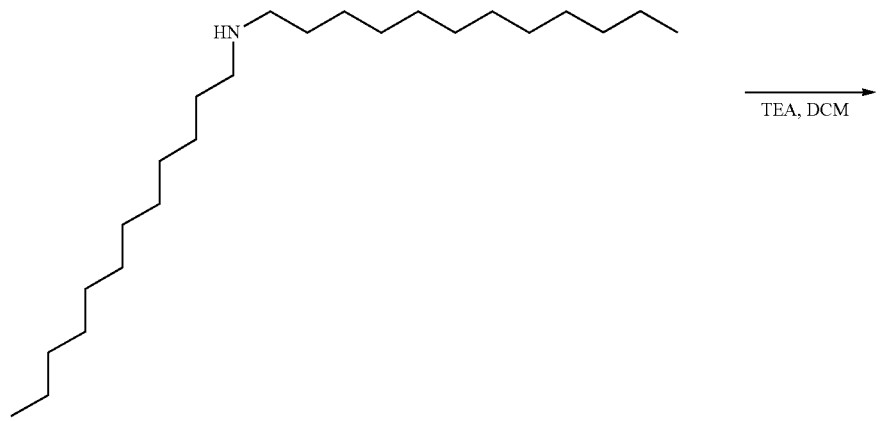

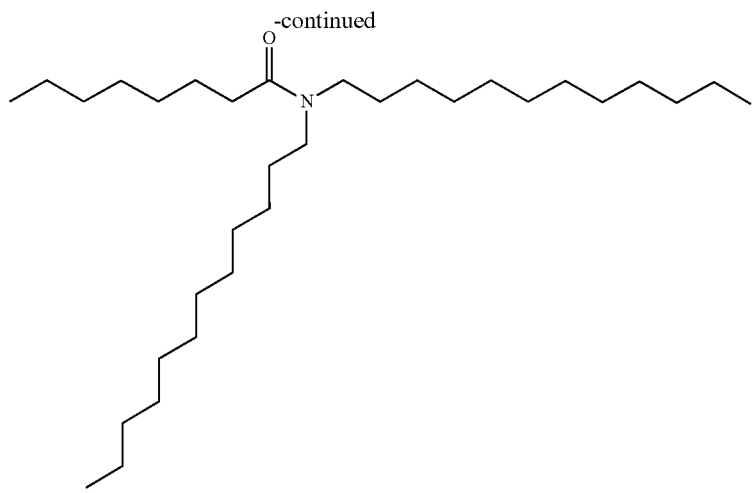

Octanoyl chloride (3.5 g, 20 mmol) was dropwise into the solution of Et₃N (2.5 g, mmol) and didodecylamine (7.1 g, 20 mmol) in DCM (30 ml) at 0° C. The reaction mixture was stirred for 6 h at room temperature. After stirring, the volatiles were removed under vacuum. Crude product was diluted with heptane and purified by silica filter. After removal of solvents, clear oil of ODDDAm was obtained. (7.3 g, Yield: 73%) The reaction is shown above.

Synthesis of Myristoyl Didecylamine (MDDAm)

Myristoyl chloride (3.5 g, 20 mmol) was dropwise into the solution of Et₃N (2.5 g, mmol) and didecylamine (5.95 g, 20 mmol) in DCM (30 ml) at 0° C. The reaction mixture was stirred for 6 h at room temperature. After stirring, the volatiles were removed under vacuum. Crude product was diluted with heptane and purified by silica filter. After removal of solvents, clear oil of MDDAm was obtained. (9.2 g, Yield: 92%) The reaction is shown above.

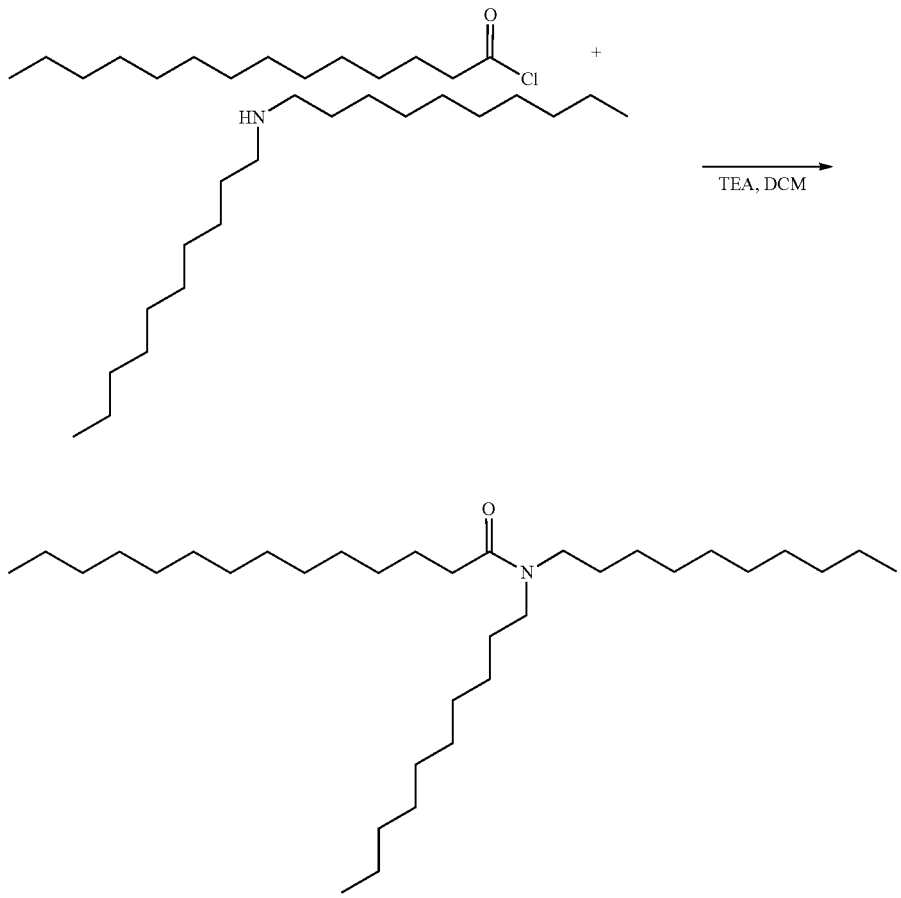

Synthesis of Myristoyl Didodecylamine (MDDDAm)

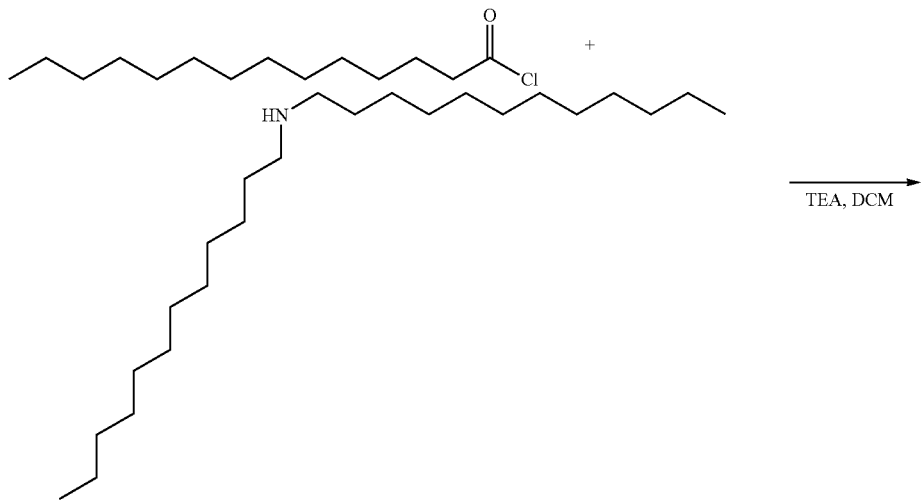

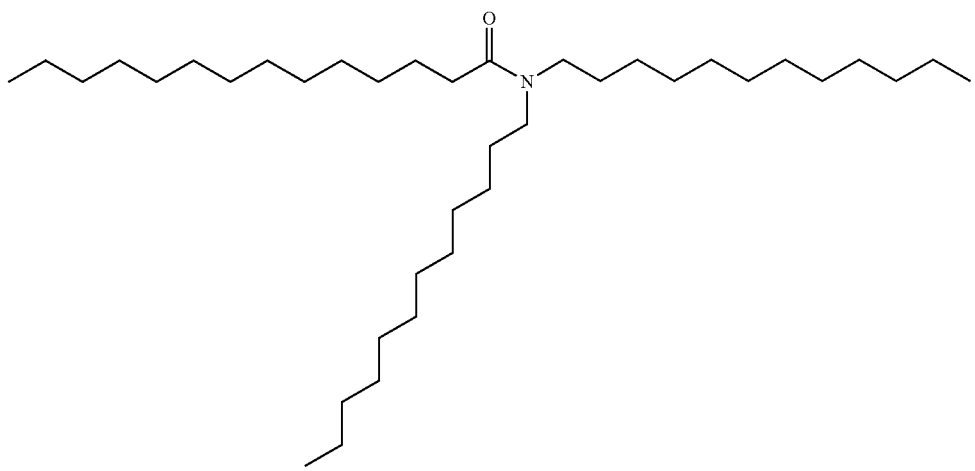

Myristoyl chloride (3.5 g, 20 mmol) was dropwise into the solution of Et$_3$N (2.5 g, mmol) and didodecylamine (7.1 g, 20 mmol) in DCM (30 ml) at 0° C. The reaction mixture was stirred for 6 h at room temperature. After stirring, the volatiles were removed under vacuum. Crude product was diluted with heptane and purified by silica filter. After removal of solvents, white powder of MDDDAm was obtained. (7.6 g, Yield: 67%) The reaction is shown above.

Example 2

Reference NTD Sample A Preparation

This example details the preparation of a reference NTD photoresist composition. The photoresist composition of the reference is prepared by admixing the following components, 2.98 g polymer-A, 0.26 g PAG-A, 0.09 g WPAG-A (weak photoacid generator), 0.07 g EBL-A (EBL—embedded barrier layer), 48.30 g propylene glycol methyl ether acetate (PGMEA), 9.66 g gamma-butyrolactone (aGBLMA) and 38.64 g methyl-2-hydroxyisobutyrate and then this mixture was filtered with a 0.2 micron Nylon filter. Polymer A comprises 1-isopropyl-adamantanyl methacrylate (IPAMA), 1-isopropylcyclopentyl methacrylate (IPCPMA), α-methacryloxy-γ-butyrolactone (aGBLMA) and 2-oxo-2-((2-oxohexahydro-2H-3,5-methanocyclopenta[b]furan-6-yl)oxy)ethyl methacrylate (MNLMA) in a molar ratio of 20:25:40:15.

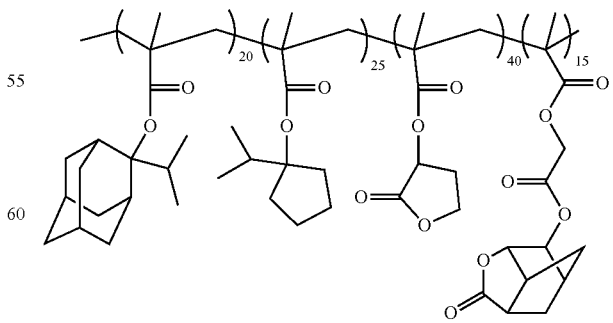

IPAMA/IPCPMA/aGBLMA/MNLMA
(20/25/40/15)

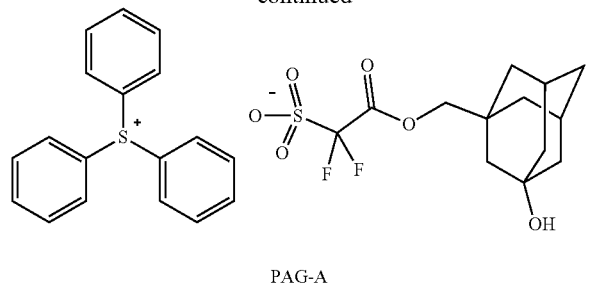

PAG-A

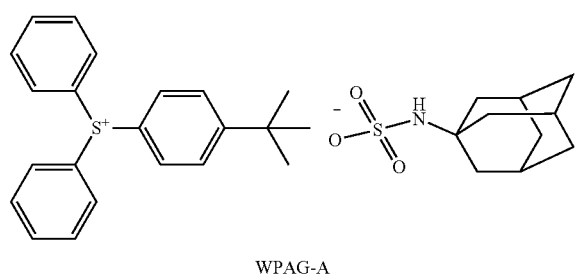

WPAG-A

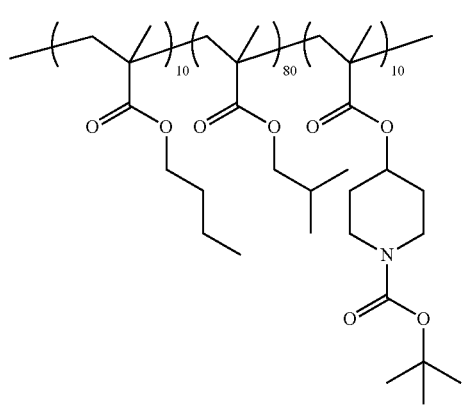

EBL-A

Reference NTD Sample B Preparation

This example too details the preparation of a reference NTD photoresist composition. The photoresist composition of the reference is prepared by admixing the following components, 2.98 g polymer-A, 0.26 g PAG-A, 0.09 g WPAG-A, 0.04 g Quencher-A, 0.07 g EBL-A, 48.30 g propylene glycol methyl ether acetate, 9.66 g gamma-butyrolactone and 38.64 g methyl-2-hydroxyisobutyrate and then this mixture was filtered with a 0.2 micron Nylon filter.

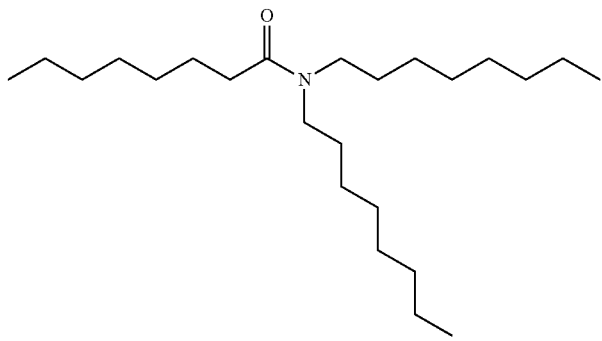

Quencher-A

Example 1 to 8 Preparation

Quenchers B-I whose structures are shown below were used to prepare photoresists as follows. The photoresist composition of the invention is prepared by admixing the following components, 2.98 g polymer-A, 0.26 g PAG-A, 0.09 g WPAG-A, 0.04 g one of quenchers shown below (Quenchers B-I), 0.07 g EBL-A, 48.30 g propylene glycol methyl ether acetate, 9.66 g gamma-butyrolactone and 38.64 g methyl-2-hydroxyisobutyrate and then this mixture was filtered with a 0.2 micron Nylon filter.

Quencher-B

-continued
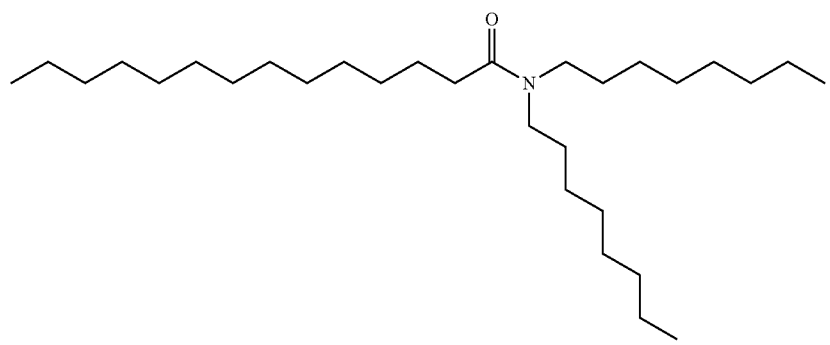
Quencher-C
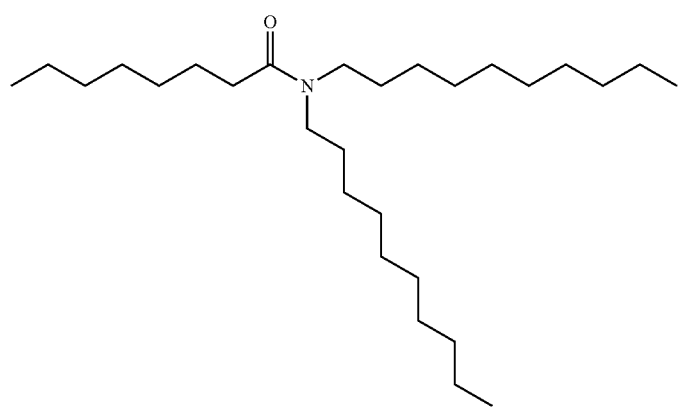
Quencher-D
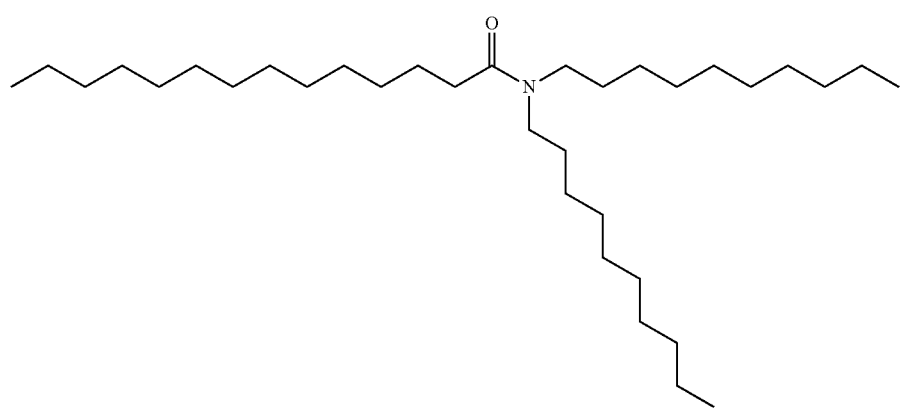
Quencher-E

-continued
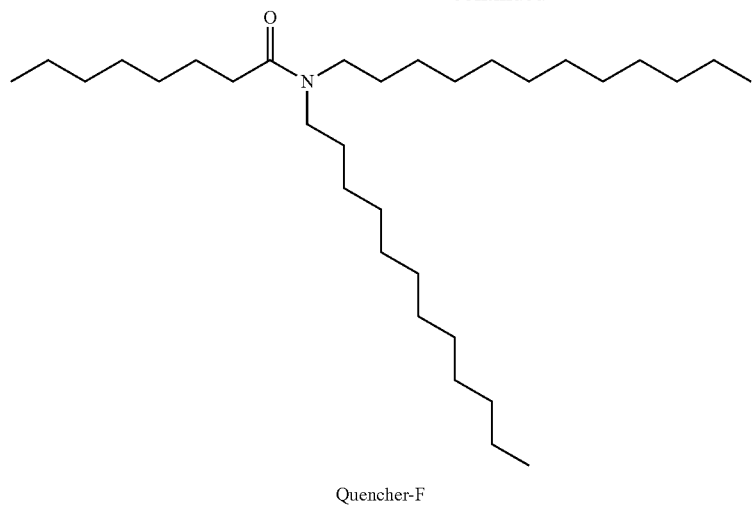
Quencher-F
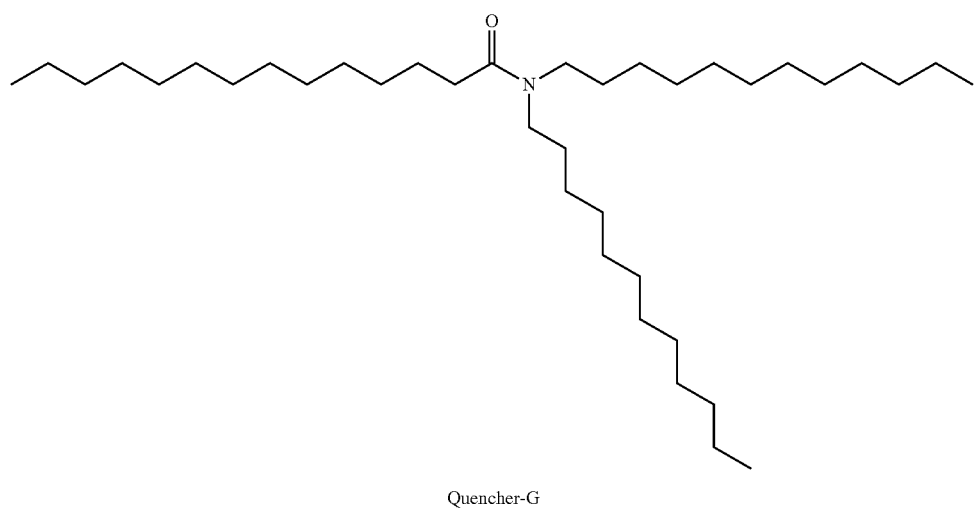
Quencher-G
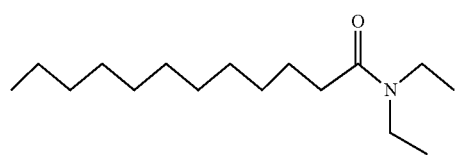
Quencher-H
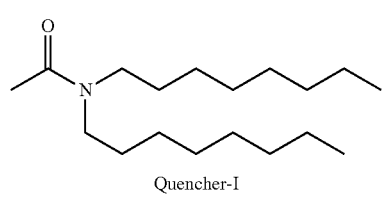
Quencher-I

Example 3

This series of examples demonstrate the utility of the trialkyl amide quencher having Log P greater than 11 in photoresist compositions. The comparative compositions and the compositions of this disclosure are shown in the Table below and were used to produce trenches as detailed below.

300 mm hexamethyl disilazane (HMDZ)-primed silicon wafers were spin-coated with AR™40 antireflectant (DuPont Electronics & Industrial) to form a first bottom anti-reflective coating (BARC) on a TEL CLEAN TRACK LITHIUS i+ (a coating and developing tool), followed by the bake process for 60 seconds at 205° C., providing the first BARC layer thickness of 710 Å. Test samples were spin-coated on the BARC to form 950 Å thickness, followed by the bake process for 60 seconds at 90° C.

The fabricated films were then exposed through a mask on Nikon S610C ArF immersion scanner using the illumination conditions as follows: 1.3 NA, Cross-pole with azimuthal polarization, δ0.90-0.59. The exposed film was then post-exposure baked at 85° C. for seconds, followed by the developing with n-butyl acetate for 18 seconds using a TEL CLEAN TRAC LITHIUS i+, which provides the pattern with negative tone development. Critical dimensions (CDs) of the pattern of 54 nm 108 pitch trench by 6% PSM mask was measured on a Hitachi CG4000 CD SEM. The results are shown in the Table below.

In the Table below Reference A-E are comparative compositions where Log P for the alkylamide quencher is less than 11, while Examples 1-5 represent inventive compositions where the trialkyl amide has Log P values that are greater than 11.

Table

TABLE

| | Quencher | $C_{number}$ of Shortest Carbon Chain | logP of Quencher | Eop | CD variation per 1 mj | Minimum trench CD before pattern collapse | Pattern profile |
|---|---|---|---|---|---|---|---|
| Reference A | — | — | — | 25 mj | 1.9 nm/mj | 48 nm | T-shape profile |
| Reference B | Quencher-A | 8 | 10.82 | 36 mj | 1.5 nm/mj | 58 nm | Good square profile |
| Reference C | Quencher-H | 2 | 5.6 | 44 mj | 2.7 nm/mj | 39 nm | T-shape profile |
| Reference D | Quencher-I | 1 | 6.69 | 48 mj | 2.1 nm/mj | 50 nm | T-shape profile |
| Reference E | Quencher-B | 7 | 10.19 | 42 mj | 1.2 nm/mj | 45 nm | T-shape profile |
| Example 1 | Quencher-C | 8 | 12.55 | 42 mj | 1.4 nm/mj | 57 nm | Good square profile |
| Example 2 | Quencher-D | 7 | 12.01 | 43 mj | 1.3 nm/mj | 55 nm | Good square profile |
| Example 3 | Quencher-E | 10 | 15.19 | 37 mj | 1.4 nm/mj | 59 nm | Good square profile |
| Example 4 | Quencher-F | 7 | 14.13 | 41 mj | 1.4 nm/mj | 58 nm | Good square profile |
| Example 5 | Quencher-G | 12 | 17.23 | 32 mj | 1.5 nm/mj | 58 nm | Good square profile |

The results from the Table show that the photoresist compositions of Examples 1-5 (which have Log P values greater than 11) produce good square profiles for the trenches.

What is claimed is:

1. A photoresist composition comprising:
   a first polymer comprising an acid labile group;
   a photoacid generator; and
   an acid diffusion control agent that comprises a tri-alkyl amide compound having a lipophilicity (log P) value that is greater than 11; wherein the tri-alkyl amide compound comprises substituted or unsubstituted linear, cyclic or branched $C_7$ to $C_{20}$ alkyls.

2. The photoresist composition of claim 1, wherein the tri-alkyl amide compound has the structure of formula (1)

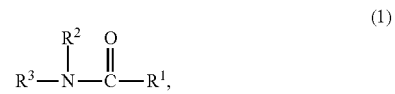

wherein $R^1$, $R^2$ and $R^3$ are independently linear, cyclic or branched $C_7$ to $C_{20}$ alkyl groups that may be substituted or unsubstituted.

3. The photoresist composition of claim 2, wherein $R^1$ has a different number of carbon atoms than $R^2$ and $R^3$.

4. The photoresist composition of claim 3, wherein $R^2$ and $R^3$ have the same number of carbon atoms.

5. The photoresist composition of claim 2, wherein $R^1$ is a linear alkyl having 7 to 13 carbon atoms and wherein $R^2$ and $R^3$ have the same number of carbon atoms and are linear alkyls having 7 to 15 carbon atoms.

6. The photoresist composition of claim 1, wherein the first polymer is derived from the polymerization of at least two of the following monomers:

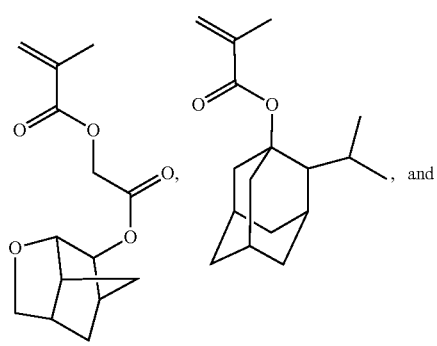

-continued

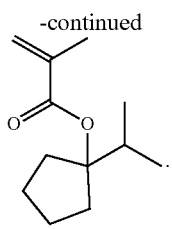

7. A pattern formation method, comprising:
(a) applying a layer of a photoresist composition of claim 1 on a substrate;
(b) pattern-wise exposing the photoresist composition layer to activating radiation; and
(c) developing the exposed photoresist composition layer to provide a resist relief image.

8. The pattern formation method of claim 7, further comprising transferring a pattern of the resist relief image to the substrate.

9. The pattern formation method of claim 7, wherein the exposed photoresist composition layer is developed with an organic solvent-based developer.

* * * * *